US010365338B2

United States Patent
Jonas et al.

(10) Patent No.: US 10,365,338 B2
(45) Date of Patent: Jul. 30, 2019

(54) SUPERCONDUCTING COIL SUPPORT DEVICE AND METHOD AND APPARATUS INCLUDING SUPERCONDUCTING COIL SUPPORT DEVICE

(71) Applicant: KONINKLIJKE PHILIPS N.V., Eindhoven (NL)

(72) Inventors: Philip Alexander Jonas, Eindhoven (NL); Johannes Adrianus Overweg, Eindhoven (NL); Matthew Voss, Eindhoven (NL); Derk Reefman, Eindhoven (NL); James Howard Kralick, Eindhoven (NL); Xianrui Huang, Eindhoven (NL); Gerardus Bernardus Jozef Mulder, Eindhoven (NL); Joshua Kent Hilderbrand, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 249 days.

(21) Appl. No.: 15/312,008

(22) PCT Filed: May 5, 2015

(86) PCT No.: PCT/IB2015/053279
§ 371 (c)(1),
(2) Date: Nov. 17, 2016

(87) PCT Pub. No.: WO2015/177667
PCT Pub. Date: Nov. 26, 2015

(65) Prior Publication Data
US 2017/0097397 A1    Apr. 6, 2017

(30) Foreign Application Priority Data
May 21, 2014 (WO) ................ PCT/CN2014/078018

(51) Int. Cl.
*G01R 33/3815* (2006.01)
*G01R 33/421* (2006.01)
(Continued)

(52) U.S. Cl.
CPC ...... *G01R 33/3815* (2013.01); *G01R 33/3802* (2013.01); *G01R 33/421* (2013.01); *H01F 6/06* (2013.01)

(58) Field of Classification Search
CPC .............. G01R 33/3415; G01R 33/543; G01R 33/5659; G01R 33/36; G01R 33/3875
(Continued)

(56) References Cited

U.S. PATENT DOCUMENTS

| 3,514,730 A | * | 5/1970 | Kassner | ................... H01F 6/06 335/216 |
| 3,559,126 A | * | 1/1971 | Drautman | ................. H01F 6/00 174/125.1 |

(Continued)

OTHER PUBLICATIONS

Kostenko, A., and R. J. Thome. "Design features of the toroidal field and central solenoid magnet systems." IEEE transactions on magnetics 30.4 (1994): 1608-1612.*
(Continued)

*Primary Examiner* — Christopher P McAndrew

(57) ABSTRACT

An apparatus includes at least a first electrically conductive coil having at least first and second coil sections which are separated and spaced apart from each other, and a support structure disposed to support the first and second coil sections. The support structure, and an associated method of supporting the electrically conductive coil, maintain relative axial positions of the first and second coil sections to be fixed when the first electrically conductive coil is energized and de-energized, and allow each of the first and second coil sections to expand radially when energized.

20 Claims, 14 Drawing Sheets

(51) Int. Cl.
  *G01R 33/38* (2006.01)
  *H01F 6/06* (2006.01)
(58) Field of Classification Search
  USPC .......................................................... 324/307
  See application file for complete search history.

(56) References Cited

U.S. PATENT DOCUMENTS

| | | | |
|---|---|---|---|
| 4,291,997 | A | 9/1981 | Laskaris |
| 4,467,303 | A | 8/1984 | Laskaris |
| 4,652,824 | A * | 3/1987 | Oppelt ............. G01R 33/34046 324/318 |
| 4,896,128 | A * | 1/1990 | Wollan ............... G01R 33/3802 324/318 |
| 5,237,300 | A | 8/1993 | Ige |
| 5,268,530 | A * | 12/1993 | Shimizu ................ H01L 39/143 174/125.1 |
| 5,532,663 | A | 7/1996 | Herd |
| 5,691,790 | A | 11/1997 | Havens et al. |
| 6,208,141 | B1 * | 3/2001 | Amor, Sr. ............ G01R 33/385 324/307 |
| 7,633,192 | B2 | 12/2009 | Zhang et al. |
| 2007/0247263 | A1 * | 10/2007 | Calvert ............. G01R 33/3802 335/216 |
| 2011/0148417 | A1 | 6/2011 | Lvovsky |
| 2011/0193665 | A1 | 8/2011 | Huang |
| 2012/0108433 | A1 | 5/2012 | Jiang et al. |

OTHER PUBLICATIONS

Kostenko, A., and R. J. Thome. "Design features of the toroidal field and central solenoid magnet systems." IEEE transactions on magnetics 30.4 (1994): 1608-1612. (Year: 1994).*

* cited by examiner

SUPERCONDUCTING COIL SUPPORT DEVICE AND METHOD AND APPARATUS INCLUDING SUPERCONDUCTING COIL SUPPORT DEVICE

CROSS REFERENCE TO RELATED APPLICATIONS

This application is a U.S. national phase application of International Application No. PCT/IB2015/053279, filed on May 5, 2015, which claims the benefit of CN Application Serial No. PCT/CN2014/078018 filed on May 21, 2014 and is incorporated herein by reference.

TECHNICAL FIELD

The present invention generally pertains to superconducting coils for a magnet, for example in a cryogenic environment. In particular, the present invention pertains to a device or structure for supporting superconducting coils while energized to produce a large magnetic field strength, and a method of supporting such superconducting coils.

BACKGROUND AND SUMMARY

Superconducting magnet systems are used in a variety of contexts, including nuclear magnetic resonance (NMR) analysis, and magnetic resonance imaging (MRI). To realize superconductivity, a magnet is maintained in a cryogenic environment at a temperature near absolute zero. Typically, the magnet system includes one or more electrically conductive coils operating as one or more magnets and which are disposed in a cryostat and cooled by a cryogenic fluid such as liquid helium to maintain superconductivity.

Some superconducting magnet systems have multiple superconducting coils or coil sections at different axial locations, as well as with different radii. For example, in some cases a superconducting magnet system for an MRI apparatus may include a main superconducting coil (sometimes called a field coil) having a plurality of main coil sections (or field coil sections) at different axial positions which have a first radius, together with a superconducting shield coil having a plurality of shield coil sections at different axial positions and which have a second radius which is greater than the first radius of the field coil.

When energized, the superconducting coils or coil sections, whose diameters for example may be on the order of one or two meters, impose large magnetic forces between them as well as large internal magnetic stresses. Additionally, when the superconducting coils are energized, the coil sections expand radially by a small amount (e.g., 1 mm or more), and this amount of radial expansion may vary according to the diameter of the coil. However, in an MRI apparatus the superconducting coils must be positioned relative to each other to within fractions of a millimeter in order to produce magnetic fields suitable for imaging. So the radial expansion of the coils upon energization presents a challenge.

Furthermore, the superconducting coils must also be kept at very low temperatures, for example disposed within a cryostat, in order to remain superconducting. Whatever structure supports the superconducting coils must locate the superconducting coils to within specified tolerances under large magnetic loads as discussed above, while not creating any energy release into the coils which could heat them or the surrounding area and thereby impact their superconducting performance.

The interface between the superconducting coils and the support structure or device can present a number of challenges. Restraining the superconducting coils and positioning the coils can create large shear stresses at the interface between the superconducting coils and the support structure. Meanwhile, large axial forces combined with large hoop forces may cause a release of energy at the interface(s) between the coil(s) and the support structure though friction or cracked bonds, and this energy may quench superconducting coils.

For MRI, the superconducting coils often use wire made with small filaments of NbTi which carries the high currents without resistance. The filaments are embedded in a copper matrix which allows current to be evenly distributed and provides stability. Often additional copper is used in the wire to both further stabilize the coils from external energy releases and to lower stress levels at the interface between the coils and the support structure. However, adding additional copper to the superconducting coils makes them less efficient magnetically, increases their thermal capacity (which takes longer to cool them down), and increases their cost.

Accordingly, it would be desirable to provide an apparatus, such as an MRI machine, which includes a support structure for a system of superconducting coils. It would further be desirable to provide such a support structure which can maintain the positions of the superconducting coils relative to each other to within tight tolerances when energized. It would still further be desirable to provide such a support structure which can accomplish these objectives without producing a large amount of frictional energy and associated heat dissipation.

In one aspect of the present invention, an apparatus comprises: at least a first electrically conductive coil having at least first and second coil sections which are separated and spaced apart from each other; and a support structure disposed to support the first and second coil sections. The support structure is configured to maintain relative axial positions of the first and second coil sections to be fixed when the first electrically conductive coil is energized and de-energized, and to allow each of the first and second coil sections to expand radially when energized.

In some embodiments, the apparatus further can further comprise: at least a second electrically conductive coil, wherein the first electrically conductive coil can be a field coil and the second electrically conductive coil can be a shield coil, wherein the shield coil can have at least first and second shield coil sections which are separated and spaced apart from each other wherein the shield coil can have a diameter which is greater than a diameter of the field coil, and wherein an axis of the shield coil can pass through a circumference defined by the field coil. The support structure can be configured to maintain relative axial positions of the first and second shield coil sections to be fixed when the first electrically conductive coil is energized and de-energized, and allow each of the first and second shield coil sections to expand radially when energized.

In some versions of these embodiments, the support structure can comprise: a first support element which can have a first portion which is disposed at a first site on the first coil section, and a second portion which is disposed at a first site on the second coil section, wherein the first support element can axially, radially, and rotationally fix the first site on the first coil section with respect to the first site on the second coil section; a second support element which can have a first portion which is disposed at a second site on the first coil section, and a second portion which is disposed at a second site on the second coil section, wherein the second support element can axially and rotationally fix the second site on the first coil section with respect to the second site on the second coil section, and allow radial movement of the first and second coil sections; a third support element which can have a first portion which is disposed at a third site on the first coil section, and a second portion which is disposed at a third site on the second coil section, wherein the third support element can axially fix the third site on the first coil section with respect to the third site on the second coil section, and allow radial and rotational movement at the third sites of the first and second coil sections; and a fourth support element which can have a first portion which is disposed at a fourth site on the first coil section, and a second portion which is disposed at a fourth site on the second coil section, wherein the fourth support element can axially fix the fourth site on the first coil section with respect to the fourth site on the second coil section, and allow radial and rotational movement at the fourth sites of the first and second coil sections.

In some versions of these embodiments, the support structure can further comprise an electrically insulating support ring having an axis which extends in parallel to an axis of the first electrically conductive coil, wherein the electrically insulating support ring can be fixedly attached to the first support element, and wherein each of the third and fourth support elements can have a slot disposed therein, wherein a first portion of the electrically insulating support ring can be disposed in the slot in the third support element, and a second portion of the electrically insulating support ring can be disposed in the slot in the fourth support element.

In some versions of these embodiments, the electrically insulating support ring can include at least one rotational restraint, wherein the second support element can have a slot disposed therein, wherein a third portion of the support ring can be disposed in the slot in the second support element, and wherein the second support element can be rotationally fixed by the at least one rotational restraint.

In some versions of these embodiments, the apparatus can further comprise at least first and second protrusions extending from the electrically insulating support ring, wherein the second support element can have a slot disposed therein, wherein a third portion of the support ring can be disposed in the slot in the second support element, and wherein the second support element can be rotationally fixed between the first and second protrusions.

In some versions of these embodiments, the apparatus can further comprise at least a second electrically conductive coil, wherein the first electrically conductive coil can be a field coil and the second electrically conductive coil can be a shield coil, wherein the shield coil can have at least first and second shield coil sections which are separated and spaced apart from each other, wherein the shield coil can have a diameter which is greater than a diameter of the field coil, wherein an axis of the shield coil can pass through a circumference defined by the field coil, and wherein the support structure can be configured to maintain relative axial positions of the first and second shield coil sections to be fixed when the first electrically conductive coil is energized and de-energized, and can allow each of the first and second shield coil sections to expand radially when energized.

In some versions of these embodiments, the support structure can be configured to cause the axis of the field coil and the axis of the shield coil to be nonaligned when at least one of the field coil and the shield coil is de-energized, and to cause the axis of the field coil and the axis of the shield coil to be aligned coaxially when the field coil and the shield coil are both energized.

In some versions of these embodiments, the first support element can have a third portion which is disposed at a first site on the first shield coil section, and a fourth portion which is disposed at a first site on the second shield coil section, wherein the first support element can axially, radially, and rotationally fix the first site on the first shield coil section with respect to the first site on the second field coil section, and the support structure can further comprise: a fifth support element which has a first portion which is disposed at a second site on the first shield coil section, and a second portion which is disposed at a second site on the second shield coil section, wherein the fifth support element can axially and rotationally fix the second site on the first shield coil section with respect to the second site on the second shield coil section, and allow radial movement of the first and second shield coil sections; a sixth support element which has a first portion which is disposed at a third site on the first shield coil section, and a second portion which is disposed at a third site on the second shield coil section, wherein the sixth support element can axially fix the third site on the first shield coil section with respect to the third site on the second shield coil section, and allow radial and rotational movement of the first and second shield coil sections; and a seventh support element which has a first portion which is disposed at a fourth site on the first shield coil section, wherein the seventh support element can axially fix the fourth site on the first shield coil section with respect to the fourth site on the second shield coil section, and allow radial and rotational movement of the first and second shield coil sections.

In some versions of these embodiments, each of the sixth and seventh support elements can have a slot disposed therein, wherein a fourth portion of the support ring can be disposed in the slot in the sixth support element, and a fifth portion of the support ring can be disposed in the slot in the seventh support element.

In some versions of these embodiments, the apparatus can further comprise at least third and fourth protrusions extending from the electrically insulating support ring, wherein the fifth support element can have a slot disposed therein, wherein a sixth portion of the support ring can be disposed in the slot in the fifth support element, and wherein the fifth support element can be rotationally fixed between the third and fourth protrusions.

In some embodiments, the first electrically conductive coil can comprise copper and an electrically superconductive material.

In some embodiments, the support structure can comprise: at least one support ring having an axis which extends in parallel to an axis of the first electrically conductive coil; a plurality of support beams connected to the support ring; a plurality of first support elements each connected to the first coil section; and a plurality of second support elements each connected to the second coil section; a plurality of hinge member pairs, each hinge member pair connecting one of the first and second support elements to one of the support beams, wherein the first and second support elements can be configured to inhibit rotational and axial movement of the first and second coil sections with respect to each other, and wherein the hinge member pairs can allow radial movement of the first and second coil sections.

In some versions of these embodiments, the apparatus can comprise at least a second electrically conductive coil, wherein the first electrically conductive coil can be a field coil and the second electrically conductive coil can be a shield coil, wherein the shield coil can have at least first and second shield coil sections which are separated and spaced apart from each other, wherein the shield coil can have a diameter which is greater than a diameter of the field coil, wherein an axis of the shield coil can pass through a circumference defined by the field coil, and wherein the support structure can be configured to maintain relative axial positions of the first and second shield coil sections to be fixed when the first electrically conductive coil is energized and de-energized, and allow each of the first and second shield coil sections to expand radially when energized.

In some versions of these embodiments, the support structure can further comprise: a plurality of third support elements each connected to the first shield coil section; a plurality of fourth support elements each connected to the second shield coil section; and a plurality of second hinge member pairs, each second hinge member pair connecting one of the third and fourth support elements to one of the support beams, wherein the third and fourth support elements can be configured to inhibit rotational and axial movement of the first and second shield coil sections with respect to each other, and wherein the second hinge member pairs can allow radial movement of the first and second shield coil sections.

In another aspect of the present invention a method is provided for supporting at least a first electrically conductive coil having at least first and second coil sections which are separated and spaced apart from each other. The method comprises: maintaining relative axial positions of the first and second coil sections to be fixed when the first electrically conductive coil is energized and de-energized; and allowing each of the first and second coil sections to expand radially when energized.

In some embodiments, the method can further comprise: axially, radially, and rotationally fixing a first site on the first coil section with respect to a first site on the second coil section; axially and rotationally fixing a second site on the first coil section with respect to a second site on the second coil section, while allowing radial movement of the first coil section at the second site on the first coil section and allowing radial movement of the second coil at the second site on the second coil section; axially fixing a third site on the first coil section with respect to a third site on the second coil section, while allowing radial and rotational movement of the first coil section at the third site on the first coil section and allowing radial and rotational movement of the second coil section at the third site on the second coil section; and axially fixing a fourth site on the first coil section with respect to a fourth site on the second coil section, while allowing radial and rotational movement of the first coil section at the fourth site on the first coil section and allowing radial and rotational movement of the second coil section at the fourth site on the second coil section.

In some versions of these embodiments, the method can further comprise supporting at least a second electrically conductive coil, wherein the first electrically conductive coil can be a field coil and the second electrically conductive coil can be a shield coil, wherein the shield coil can have at least first and second shield coil sections which are separated and spaced apart from each other, wherein the shield coil can have a diameter which is greater than a diameter of the field coil, wherein an axis of the shield coil can pass through a circumference defined by the field coil. The method can further comprising: maintaining relative axial positions of the first and second shield coil sections to be fixed when the first electrically conductive coil is energized and de-energized, and allowing each of the first and second shield coil sections to expand radially when energized.

In some versions of these embodiments, the method can further comprise the axis of the field coil and an axis of the shield coil being nonaligned when at least one of the field coil and the shield coil is de-energized, and the axis of the field coil and the axis of the shield coil being aligned coaxially when the field coil and the shield coil are both energized.

In some versions of these embodiments, the method can further comprise: axially, radially, and rotationally fixing a first site on the first shield coil section with respect to a first site on the second shield coil section; axially and rotationally fixing a second site on the first shield coil section with respect to a second site on the second shield coil section, while allowing radial movement of the first shield coil section at the second site on the first shield coil section and allowing radial movement of the second shield coil at the second site on the second shield coil section; axially fixing a third site on the first shield coil section with respect to a third site on the second shield coil section, while allowing radial and rotational movement of the first shield coil section at the third site on the first shield coil section and allowing radial and rotational movement of the second shield coil section at the third site on the second shield coil section; and axially fixing a fourth site on the first shield coil section with respect to a fourth site on the second shield coil section, while allowing radial and rotational movement of the first shield coil section at the fourth site on the first shield coil section and allowing radial and rotational movement of the second shield coil section at the fourth site on the second shield coil section.

In some embodiments, the method can further comprise allowing each of the first and second coil sections to expand radially when energized via a plurality of hinged support elements each connected to one of the first coil section and the second coil section.

In some versions of these embodiments, the method can further comprise: supporting at least a second electrically conductive coil, wherein the first electrically conductive coil can be a field coil and the second electrically conductive coil can be a shield coil, wherein the shield coil can have at least first and second shield coil sections which are separated and spaced apart from each other, wherein the shield coil can have a diameter which is greater than a diameter of the field coil, wherein an axis of the shield coil can pass through a circumference defined by the field coil. The method can further comprise: maintaining relative axial positions of the first and second shield coil sections to be fixed when the first electrically conductive coil is energized and de-energized, and allowing each of the first and second shield coil sections to expand radially when energized via a plurality of additional hinged support elements each connected to one of the first shield coil section and the second shield coil section.

In yet another aspect of the invention, an apparatus comprises: an electrically conductive field coil; an electrically conductive shield coil, wherein the shield coil has a diameter which is greater than a diameter of the field coil, and wherein an axis of the shield coil passes through a circumference defined by the field coil; and a support structure disposed to support the field coil and the shield coil. The support structure is configured to cause an axis of the field coil and the axis of the shield coil to be nonaligned when at least one of the field coil and the shield coil is de-energized, and to cause the axis of the field coil and the axis of the shield coil to be aligned coaxially when the field coil and the shield coil are both energized.

In some embodiments, the field coil can have at least first and second field coil sections which are separated and spaced apart from each other, and the field coil can have at least first and second field coil sections which are separated and spaced apart from each other.

In some versions of these embodiments, the support structure can be configured to maintain relative axial positions of the first and second field coil sections to be fixed when the electrically conductive field coil is energized and de-energized, and to allow each of the first and second field coil sections to expand radially when energized, and the support structure can be further configured to maintain relative axial positions of the first and second shied coil sections to be fixed when the electrically conductive shield coil is energized and de-energized, and to allow each of the first and second shield coil sections to expand radially when energized.

In some versions of these embodiments, the support structure can further comprise: an electrically insulating support ring having an axis which extends in parallel to the axis of the field coil and the axis of the shield coil; and a plurality of support elements operatively engaged with the field coil, the shield coil, and the electrically insulating support ring so as to fix axial positions of the field coil and the shield coil with respect to each other, while permitting radial expansion of the field coil and radial expansion of the shield coil, wherein an amount of radial expansion of the field coil is different from an amount of radial expansion of the shield coil.

BRIEF DESCRIPTION OF THE DRAWINGS

The present invention will be more readily understood from the detailed description of exemplary embodiments presented below considered in conjunction with the accompanying drawings, in which.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as teaching examples of the invention. Within the present disclosure and claims, when something is said to have approximately a certain value, then it means that it is within 10% of that value, and when something is said to have about a certain value, then it means that it is within 25% of that value.

Figure 1:
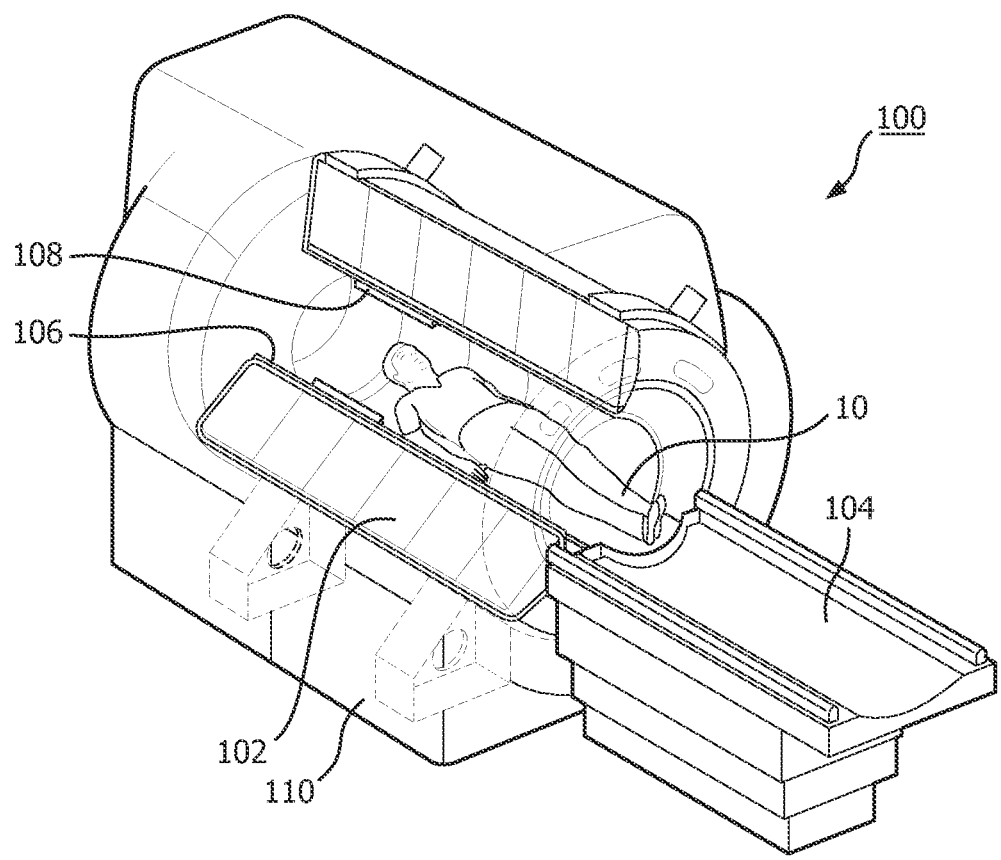
FIG. 1 illustrates an exemplary embodiment of a magnetic resonance imaging (MRI) apparatus.

FIG. 1 illustrates an exemplary embodiment of a magnetic resonance imaging (MRI) apparatus 100. MRI apparatus 100 includes a magnet system 102; a patient table 104 configured to hold a patient 10; gradient coils 106 configured to at least partially surround at least a portion of patient 10 for which MRI apparatus 100 generates an image; a radio frequency coil 108 configured to apply a radio frequency signal to at least the portion of patient 10 which is being imaged, and to alter the alignment of the magnetic field. The general operation of an MRI apparatus is well known and therefore will not be repeated here.

Figure 2:
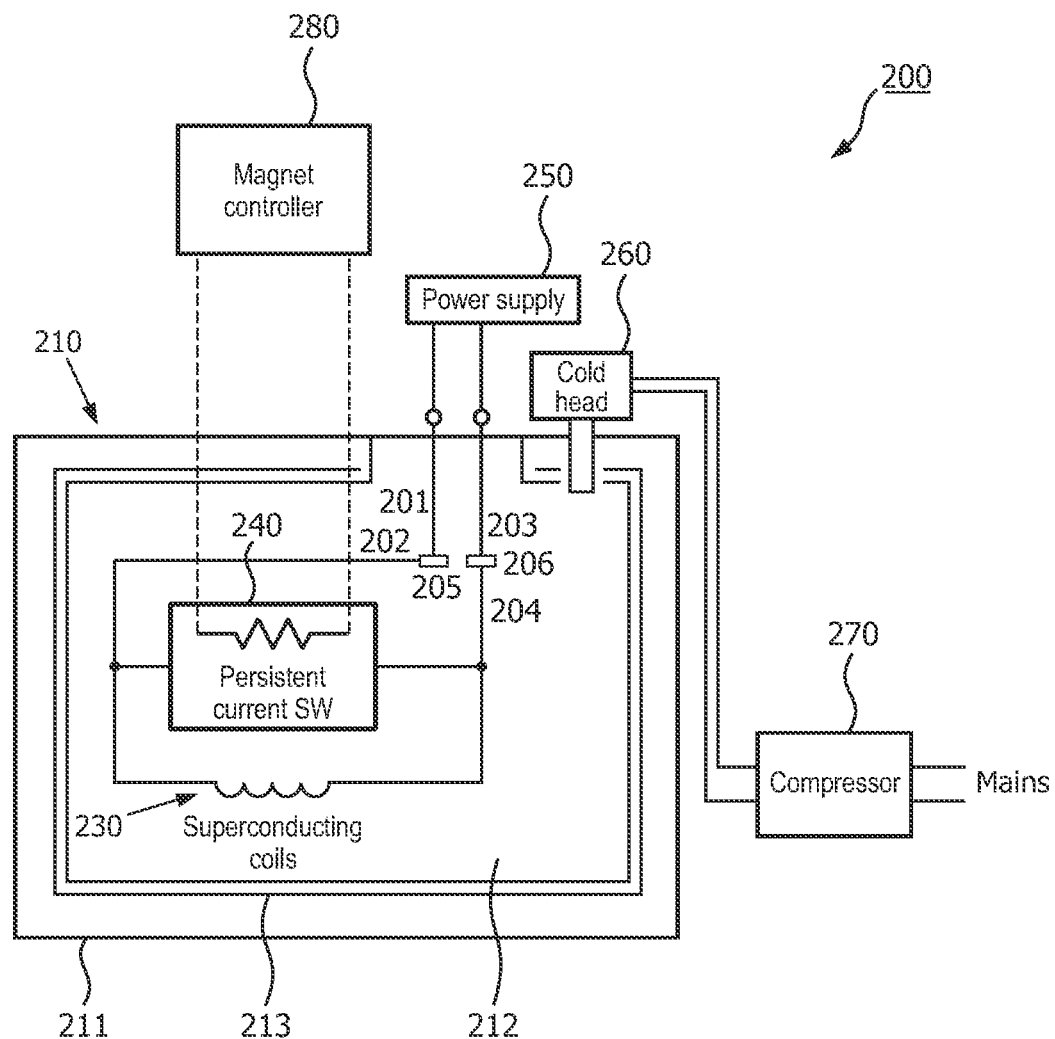
FIG. 2 is a functional diagram illustrating one example embodiment of a superconducting magnet system which may be employed in an MRI apparatus.

FIG. 2 illustrates one example embodiment of a superconducting magnet system 200 which may be employed in an MRI apparatus, such as MRI apparatus 100. In particular, superconducting magnet system 200 may be one embodiment of magnet system 102 in MRI apparatus 100. It should be understood that, in general, superconducting magnet system 200 may include many other components which are not illustrated in FIG. 2. Some components have been omitted from FIG. 2 for clarity of illustration, and so as not to obscure aspects of the present invention to be discussed below.

Superconducting magnet system 200 includes a cryostat 210 having an enclosure, or outer vacuum container, 211 and a thermal shield 213 disposed within enclosure 211 and a helium tank 212.

Superconducting magnet system 200 includes one or more electrically conductive coil(s) 230 and a persistent current switch 240 disposed within helium tank of cryostat 210, and a power supply 250 disposed outside of (external to) cryostat 210. Superconducting magnet system 200 further includes a cold head 260 driven by a compressor 270 to recondense helium from helium tank 212. Superconducting magnet system 200 further includes a magnet controller 280 which may control various operations of superconducting magnet system 200.

Superconducting magnet system 200 further includes first and second electrically conductive leads 201 and 202 and third and fourth electrically conductive leads 203 and 204. First and second electrically conductive leads 201 and 202 are connected to each other at an electrical contact 205, and third and fourth electrically conductive leads 203 and 204 are connected to each other at an electrical contact 206. First electrically conductive lead 201 is connected to power supply 250 via a switch 215. Third electrically conductive lead 203 is also connected to power supply 250. Second and fourth electrically conductive leads 202 and 204 are connected to opposite ends of electrically conductive coil(s) 230.

Beneficially, superconducting magnet system 200 is a helium bath type system. In some embodiments, helium tank 212 may contain a relatively small amount of cryogenic fluid compared to helium volumes in typical helium bath type systems, for example 50 to 100 liters (or less) of liquid helium.

Persistent current switch 240 is disposed within helium tank 212 and may comprise a piece of superconductor wire connected across opposite ends of electrically conductive coil(s) 230 via second and fourth electrically conductive leads 202 and 204, attached to a small heater.

Superconducting magnet system 200 may have one or more sensors (not shown in FIG. 2) for measuring various operating parameters, such as temperatures, at various locations, levels of cryogenic fluid (e.g., liquid helium), whether components such as compressor 270 are properly operating, whether the power has been lost, for example due to an electrical power outage, etc. Each sensor may be connected to magnet controller 280 and supply a corresponding sensor signal to magnet controller 280.

Magnet controller 280 may comprise a processor and memory, including nonvolatile memory and volatile memory. The nonvolatile memory may store programming code or instructions (software) for causing the processor to execute one or more algorithms for controlling operations of superconducting magnet system 200. In some embodiments, first and third electrically conductive leads 201 and 203 each may be retractable.

During a startup operation of superconducting magnet system 200, retractable leads 201 and 203 are inserted into helium tank 212 and the wire in persistent current switch 240 is heated above its transition temperature so that it becomes resistive. In some embodiments, first and third electrically conductive leads 201 and 203 may each have a protruding pin at an end thereof which may be received and coupled into a socket provided in each of electrical contacts 205 and 206.

Electrically conductive coil(s) 230 is/are initially energized by external power supply 250 passing a current through electrically conductive coil(s) 230. Since the wire in persistent current switch 240 is being heated during the startup operation, its resistance is substantially greater than that of electrically conductive coil(s) 230, so the current from the external power supply passes through electrically conductive coil 230.

To transition to operation in persistent mode, the current through electrically conductive coil(s) 230 is adjusted until the desired magnetic field is obtained, then the heater in persistent current switch 240 is turned off. After the heater is turned off, the superconductor wire in persistent current switch 240 cools to its superconducting temperature, short-circuiting electrically conductive coil(s) 230, which as mentioned above is also superconducting. The current in the power supply is ramped down and leads 201 and 203 are retracted from helium tank 212.

Figure 3:
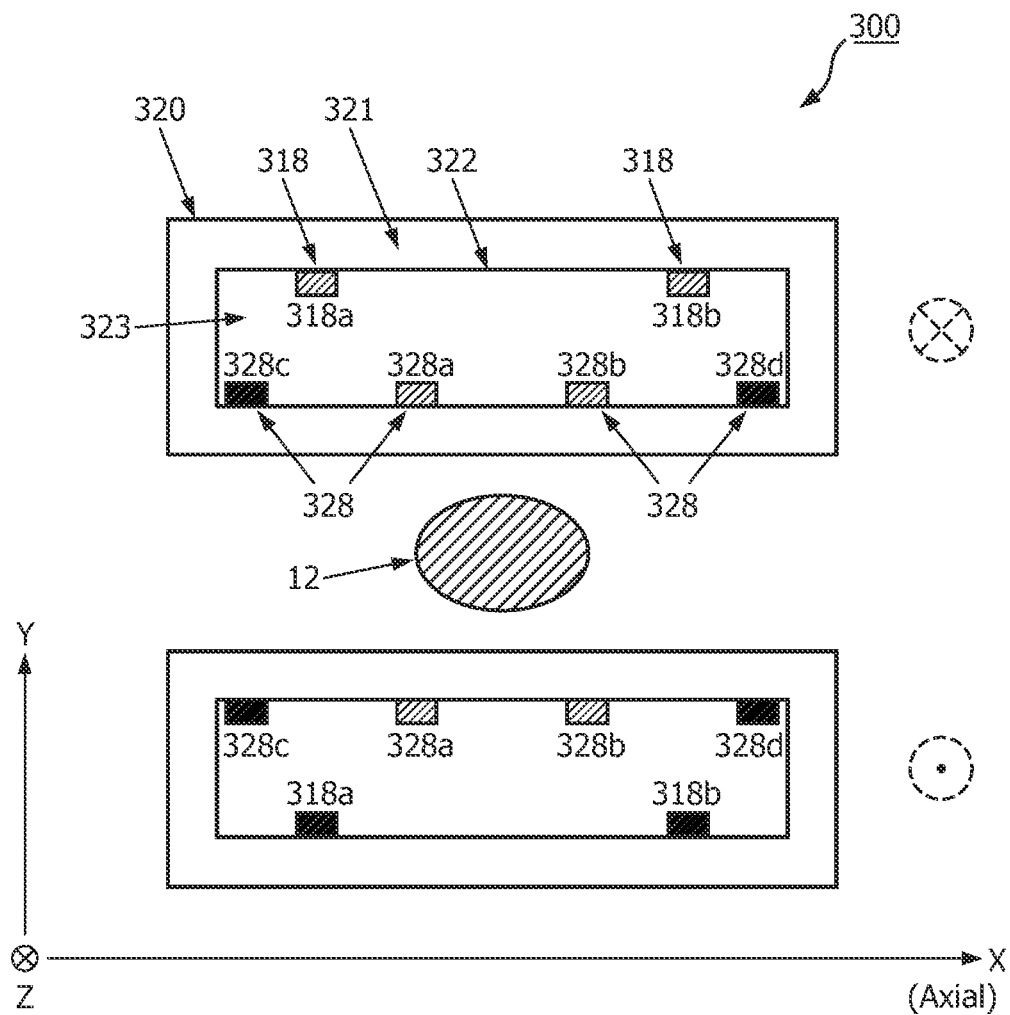
FIG. 3 is a conceptual illustration of a portion of one exemplary embodiment of a superconducting magnet system.

FIG. 3 is a conceptual illustration of a portion of one exemplary embodiment of a superconducting magnet system 300. In particular, FIG. 3 illustrates conceptually a cross-section of a portion of one exemplary embodiment of a superconducting magnet system 300 which may be employed in an MRI apparatus, such as MRI apparatus 100, to produce one or more images of a region of interest 12, for example tissue of a patient. For simplicity of illustration, some components of the MR imager, such as gradient coils, an RF coil, etc. are omitted from FIG. 3. Superconducting magnet system 300 may be one embodiment of magnet system 102 in MRI apparatus 100.

Superconducting magnet system 300 includes a cryostat 320 having an inner chamber 322 which is surrounded or substantially (i.e., at least 90%) surrounded by a vacuum region 321. Disposed within inner chamber 322 are: a superconducting magnet comprising one or more superconducting coils 328 (referred to hereafter as a "field coil 328") and a cryogenic fluid 323. In some embodiments, cryogenic fluid 323 may comprise liquid helium. In some embodiments, a cryogenic fluid of helium gas also may be disposed within inner chamber 322 of cryostat 320. In some embodiments, one or more shield coils 318 are also disposed within inner chamber 322. In some embodiments, a shield coil 318 may not be disposed within cryostat 320.

As conceptually illustrated in FIG. 3, field coil 328 includes first, second, third and fourth field coil sections 328a, 328b, 328c and 328d, which are separated and spaced apart from each other but which are electrically connected together (not depicted in FIG. 3) to form a unitary coil. Although FIG. 3 depicts an embodiment where the number of field coil sections is four, in other embodiments the number of field coil sections may be different than four. Similarly, shield coil 318 includes first and second shield coil sections 318a and 318b, which are separated and spaced apart from each other but which are electrically connected together (not depicted in FIG. 3) to form a unitary coil. Although FIG. 3 depicts an embodiment where the number of shield coil sections is two, in other embodiments the number of shield coil sections may be different than two.

FIGS. 4-10 are various views of portions of one exemplary embodiment of a superconducting magnet system and a support structure 400 for the superconducting magnet system. In some embodiments, the superconducting magnet system of FIGS. 4-10 may comprise magnet system 102, superconducting magnet system 200, and/or superconducting magnet system 300.

Figure 4:
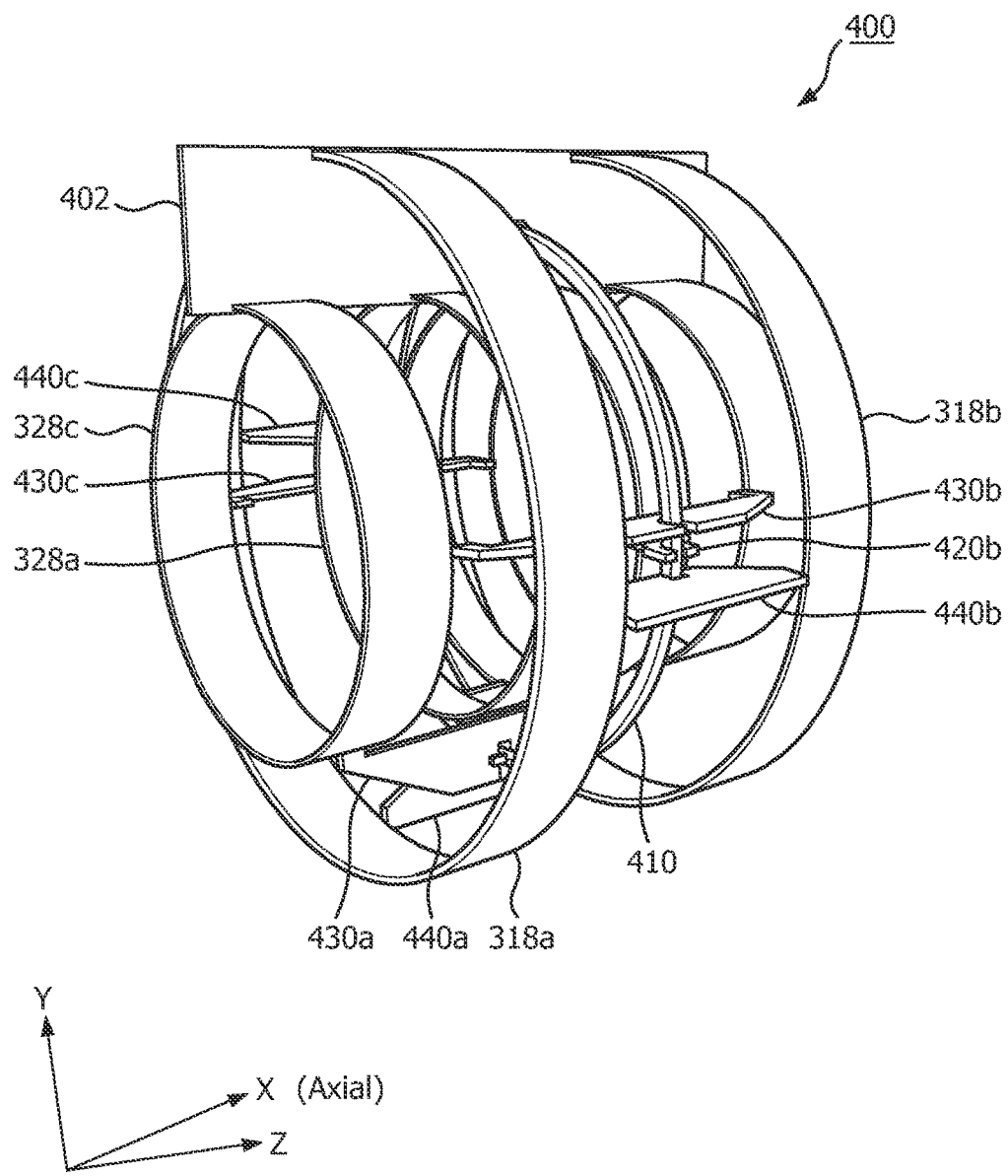
FIG. 4 is a first perspective view of a portion of one exemplary embodiment of a superconducting magnet system and a support structure for the superconducting magnet system.
Figure 5:
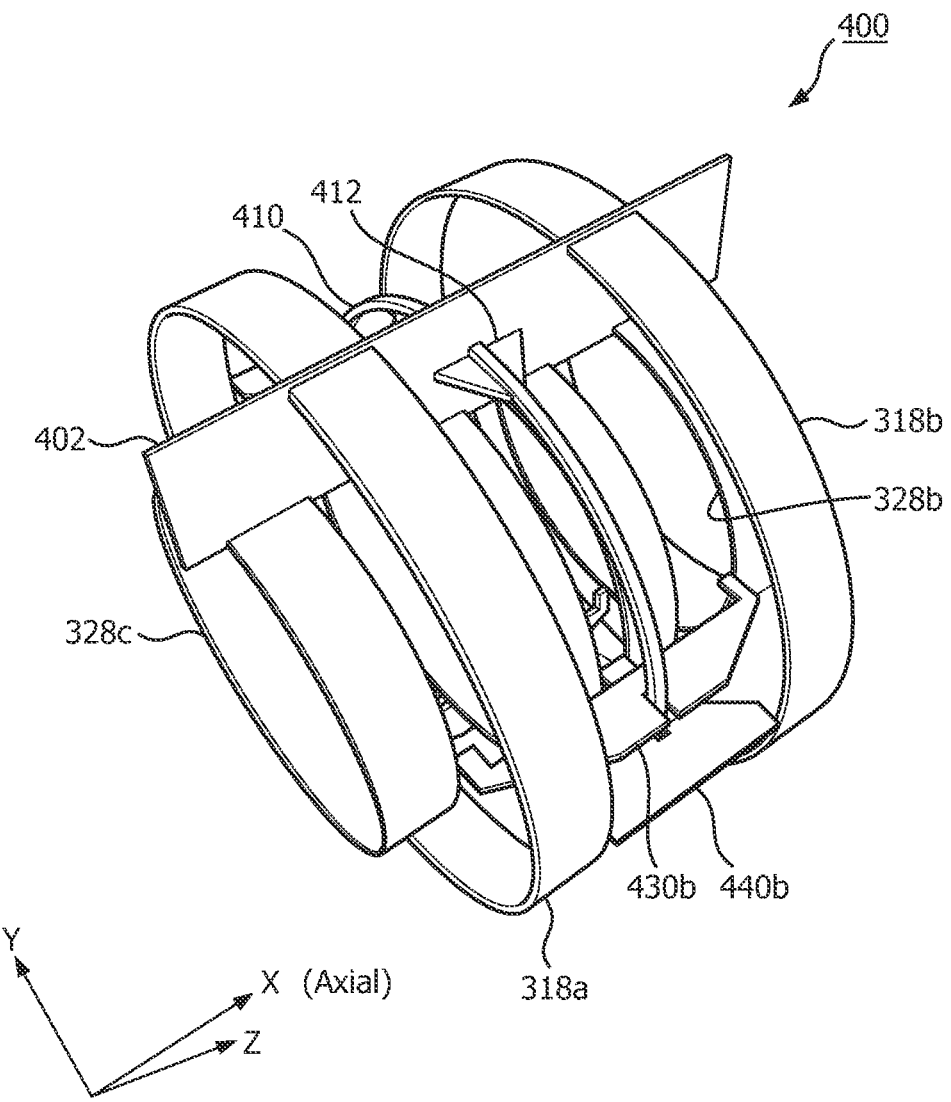
FIG. 5 is a second perspective view of a portion of one exemplary embodiment of a superconducting magnet system and a support structure for the superconducting magnet system.
Figure 6:
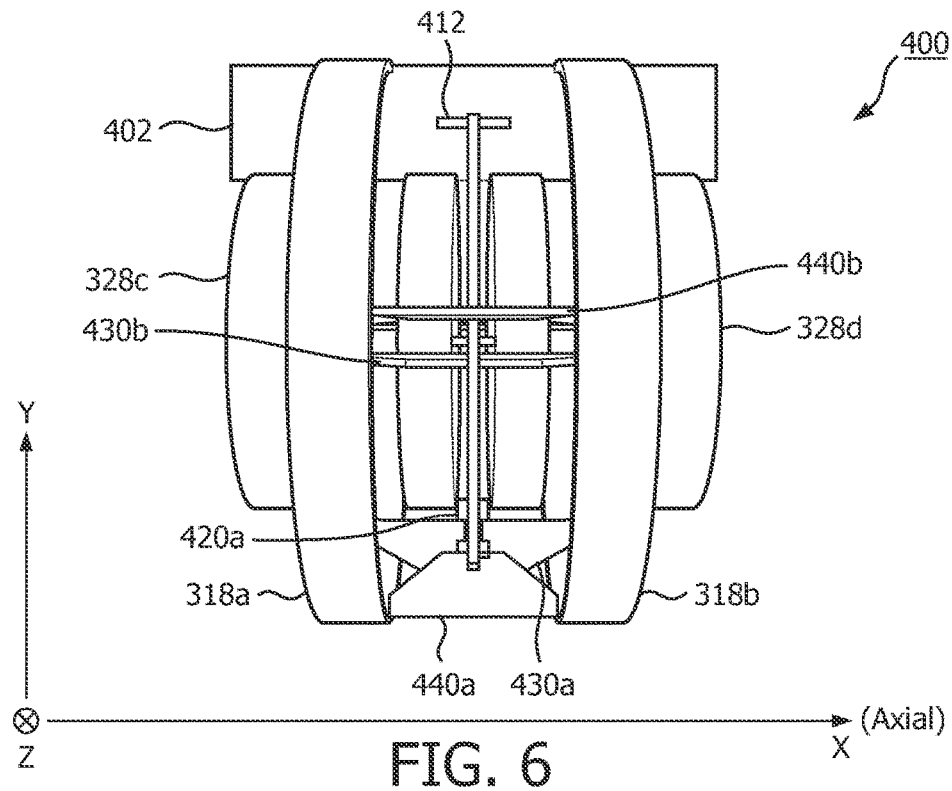
FIG. 6 is a side view of a portion of one exemplary embodiment of a superconducting magnet system and a support structure for the superconducting magnet system.
Figure 7:
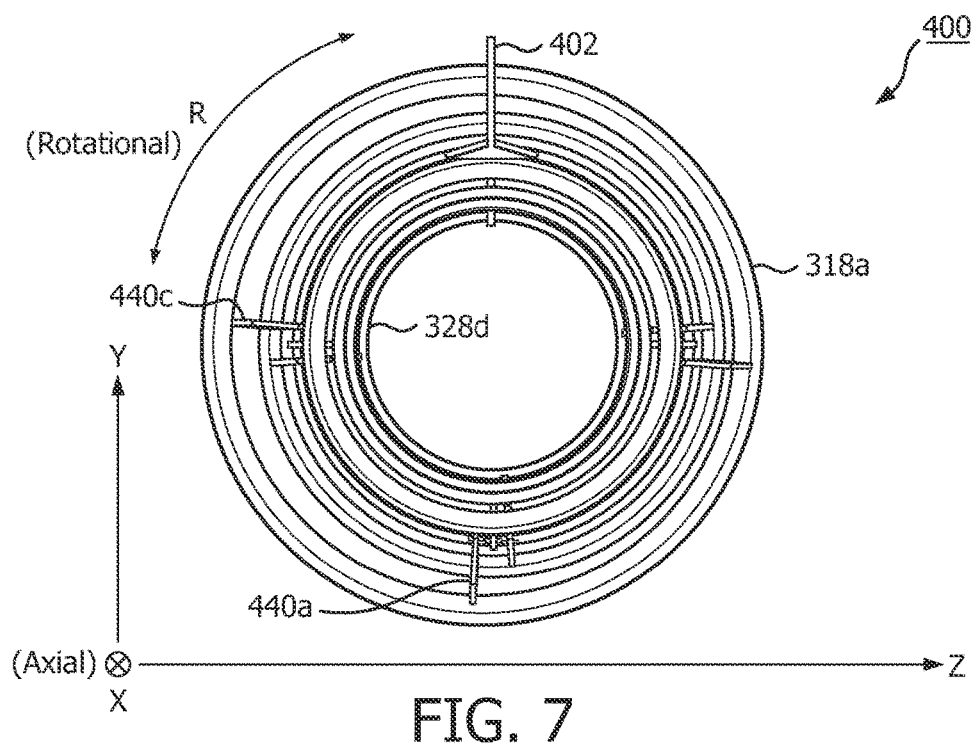
FIG. 7 is a front view of a portion of one exemplary embodiment of a superconducting magnet system and a support structure for the superconducting magnet system.
Figure 8:
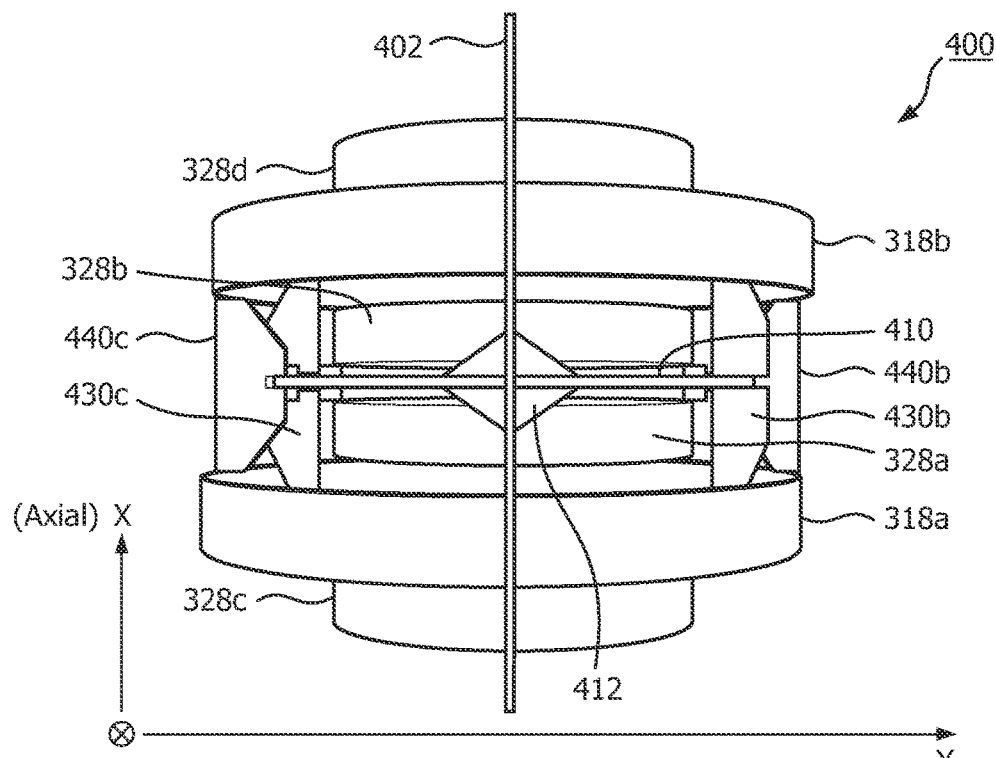
FIG. 8 is a top view of a portion of one exemplary embodiment of a superconducting magnet system and a support structure for the superconducting magnet sy stem.
Figure 9:
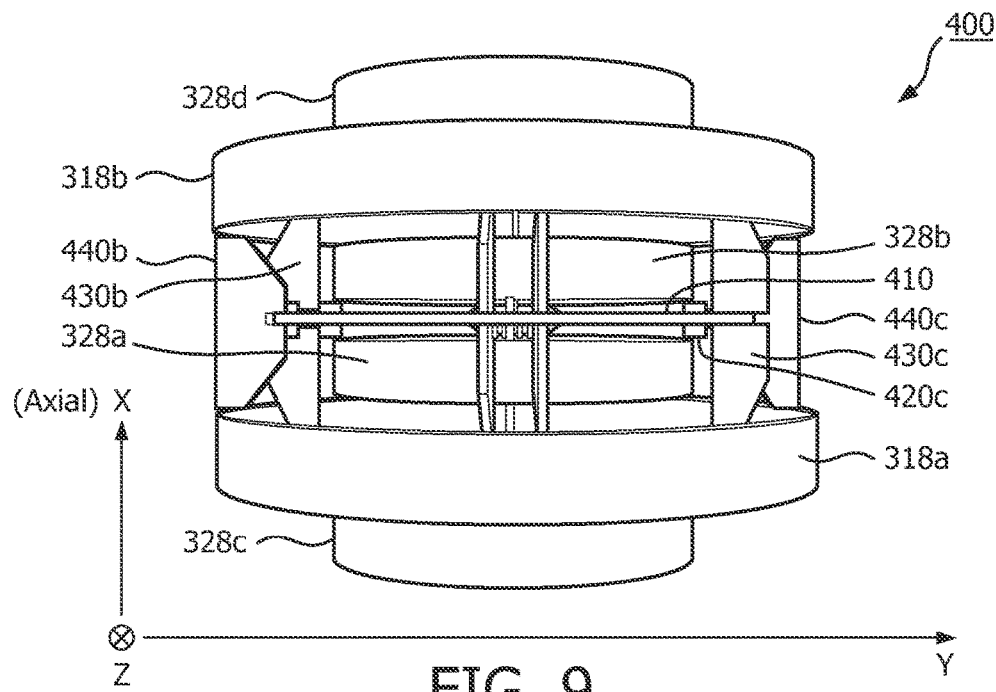
FIG. 9 is a bottom view of a portion of one exemplary embodiment of a superconducting magnet system and a support structure for the superconducting magnet sy stem.
Figure 10:
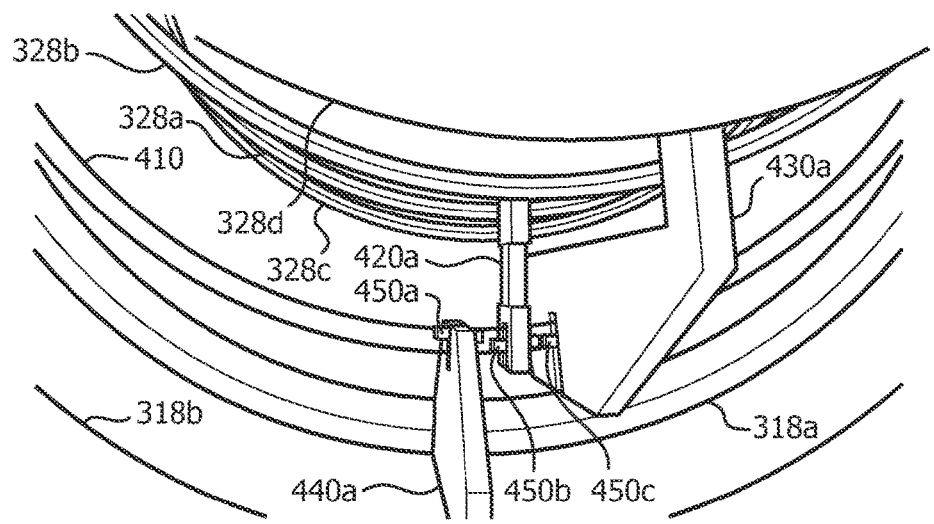
FIG. 10 is a close-up view of a portion of the bottom of one exemplary embodiment of a superconducting magnet system and a support structure for the superconducting magnet system.

In particular: FIG. 4 is a first perspective view of a portion of one exemplary embodiment of a superconducting magnet system and a support structure 400 for the superconducting magnet system; FIG. 5 is a second perspective view of a portion of one exemplary embodiment of a superconducting magnet system and a support structure for the superconducting magnet system; FIG. 6 is a side view of a portion of one exemplary embodiment of a superconducting magnet system and a support structure for the superconducting magnet system; FIG. 7 is a front view of a portion of one exemplary embodiment of a superconducting magnet system and a support structure for the superconducting magnet system; FIG. 8 is a top view of a portion of one exemplary embodiment of a superconducting magnet system and a support structure for the superconducting magnet system; FIG. 9 is a bottom view of a portion of one exemplary embodiment of a superconducting magnet system and a support structure for the superconducting magnet system; and FIG. 10 is a close-up view of a portion of the bottom of one exemplary embodiment of a superconducting magnet system and a support structure for the superconducting magnet system.

Various elements of support structure 400 as described in greater detail below may be illustrated in one or more of FIGS. 4-10, but not all elements are labeled in each drawing, for clarity of illustration. Various directions are labeled in one or more of the drawings of FIGS. 4-10 which will be used in the description to follow. In particular, FIGS. 4-10 collectively illustrate X, Y, Z, and R directions (the R direction is only shown in FIG. 7). In the description to follow, the X direction will be referred to as the axial direction, and the R direction will be referred to as the rotational direction. Expansion or movement of an element or component in the Y-Z plane will be referred to as radial expansion or radial movement.

Support structure 400 illustrates a general embodiment which is configured with elements or components to support both a first electrically conductive coil (e.g., field coil 328) and a second electrically conductive coil (e.g., shield coil 318). However, in other embodiments, variations of support structure 400 may only include elements or components for supporting only field coil 328 or only shield coil 318. Furthermore, variations of support structure 400 may be configured to support more or less than four field coil sections, and/or more than two shield coil sections.

As described in greater detail below, support structure 400 may be configured, among other things, to support first and second field coil sections 328*a* and 328*b*, and to maintain relative axial positions of first and second field coil sections 328*a* and 328*b* to be fixed when field coil 328 is energized and de-energized, while allowing first and second field coil sections 328*a* and 328*b* to expand radially when energized. Similarly, support structure 400 may be configured, among other things, to support third and fourth field coil sections 328*c* and 328*d*, and to maintain relative axial positions of third and fourth field coil sections 328*c* and 328*d* to be fixed when field coil 328 is energized and de-energized, while allowing third and fourth field coil sections 328*c* and 328*d* to expand radially when energized. Additionally, support structure 400 may be configured, among other things, to support first and second shield coil sections 318*a* and 318*b*, and to maintain relative axial positions of first and second shield coil sections 318*a* and 318*b* to be fixed when shield coil 318 is energized and de-energized, while allowing first and second shield coil sections 328*a* and 328*b* to expand radially when energized. Furthermore, in some embodiments support structure 400 may be configured, among other things, to support field coil 328 and shield coil 318 such that the axis of field coil 328 and the axis of shield coil 318 are nonaligned or offset from each other when field coil 328 and/or shield coil 318 is de-energized, and to cause the axis of field coil 328 and the axis of shield coil 318 to be aligned coaxially with each other when field coil 328 and shield coil 318 are both energized.

Support structure 400 includes a first support element 402, a second support element 420*a*, a third support element 420*b*, and a fourth support element 420*c*. Beneficially, first, second, third, and fourth support elements 402, 420*a*, 420*b*, and 420*c* may each comprise an electrically nonconductive or electrically insulative material. In some embodiments, at least second support element 420*a*, a third support element 420*b* and a fourth support element 420*c* may each comprise a flexible component which is deformable to some degree in the X, Y, Z and R directions. In some embodiments, first support element 402 may comprise a more rigid structure. In some embodiments, first support element 402 may be fixedly attached (directly or indirectly) to an interior wall of a cryostat, such as cryostat 210 and/or cryostat 320.

Support structure 400 further includes a support ring 410, which may be electrically insulating. Support ring 410 is aligned substantially in parallel with field coil 328 and shield coil 318. More specifically, the axis of support ring 410 extends in the X direction in parallel to the axis of field coil 328 and the axis of shield coil 318. In some embodiments, when field coil 328 and shield coil 318 are energized, the axis of support ring 410 may be coaxially aligned with the axes of field coil 328 and shield coil 318. Support ring 410 is fixedly attached to first support element 402 via insulating ring connector 412. As best seen in FIG. 10, support ring has associated therewith a plurality of pairs of protrusions 450*a*, 450*b*, and 450*c* generally at a "bottom" portion thereof whose function and purpose will be described below.

First support element 402 has a first portion which is disposed at a first site on first field coil section 328*a* (e.g., the "top" of first field coil section 328*a*), and a second portion which is disposed at a first site on second field coil section 328*b* (e.g., the "top" of second field coil section 328*b*). First support element 402 axially (X direction), radially (Y-Z plane), and rotationally (R direction) fixes the first site on first field coil section 328*a* (e.g., the "top" of first field coil section 328*a*) with respect to the first site on second field coil section 328*b* (e.g., the "top" of second field coil section 328*b*). That is, in the embodiment of FIGS. 4-10, the tops of first field coil section 328*a* and second field coil section 328*b* are fixed in position with respect to each other axially, radially, and rotationally by first support element 402.

Second support element 420*a* has a first portion which is disposed at a second site on first field coil section 328*a* (e.g., the "bottom" of first field coil section 328*a*), and a has second portion which is disposed at a second site on second field coil section 328*b* (e.g., the "bottom" of second field coil section 328*b*). As best seen in FIGS. 4 and 10, second support element 420*a* further has a slot formed therein, and a portion of support ring 410 is disposed in the slot. Axial (X direction) movement of second support element 420*a* is restrained by virtue of the portion of support ring 410 being inserted within its slot. As best seen in FIG. 10, second support element 420*a* is rotationally (R direction) fixed with respect to support ring 410 by the pair of protrusions 450*b*. That is, the pair of protrusions 450*b* operates to restrain or prevent rotational movement of second support element 420*a*. By means of its interaction with support ring 410 as described above, second support element 420*a* axially (X direction) and rotationally (R direction) fixes the second site on first field coil section 328*a* (e.g., the bottom of first field coil section 328*a*) with respect to the second site on second field coil section 328*b* (e.g., the bottom of second field coil section 328b), but allows radial (substantially in the Y direction) movement or expansion of first and second field coil sections 328a and 328b at their respective second sites (e.g., at the bottoms thereof) by allowing support ring 410 to slide radially within the slot in second support element 420a.

Third support element 420b has a first portion which is disposed at a third site on first field coil section 328a (e.g., a first side which is rotated approximately 90 degrees from the "top" of first field coil section 328a), and a second portion which is disposed at a third site on second field coil section 328b (e.g., a first side which is rotated approximately 90 degrees from the "top" of second field coil section 328b). As best seen in FIG. 4, third support element 420b further has a slot formed therein, and a portion of support ring 410 is disposed in the slot. Axial (X direction) movement of third support element 420b is restrained by virtue of the portion of support ring 410 being inserted within its slot. By means of its interaction with support ring 410 as described above, third support element 420b axially (X direction) fixes the third site on first field coil section 328a with respect to the third site on third field coil section 328b, but allows rotational (R direction) and radial (substantially in the Y direction) movement or expansion of first and second field coil sections 328a and 328b at their respective third sites (e.g., at first sides thereof) by allowing support ring 410 to slide radially and rotationally within the slot in third support element 420b.

Fourth support element 420c is similar in construction and operation to third support element 420b. In particular, fourth support element 420c has a first portion which is disposed at a fourth site on first field coil section 328a (e.g., a second side which is rotated approximately 90 degrees from the "top" of first field coil section 328a), and a second portion which is disposed at a fourth site on second field coil section 328b (e.g., a second side which is rotated approximately 90 degrees from the "top" of second field coil section 328b). Fourth support element 420c further has a slot formed therein, and a portion of support ring 410 is disposed in the slot. Axial (X direction) movement of fourth support element 420c is restrained by virtue of the portion of support ring 410 being inserted within its slot. By means of its interaction with support ring 410 as described above, fourth support element 420c axially (X direction) fixes the fourth site on first field coil section 328a with respect to the fourth site on second field coil section 328b, but allows rotational (R direction) and radial (substantially in the Y direction) movement or expansion of first and second field coil sections 328a and 328b at their respective fourth sites (e.g., at second sides thereof) by allowing support ring 410 to slide radially and rotationally within the slot in fourth support element 420c.

As noted above, in some embodiments a support structure may support only a pair of coil sections, in which case additional elements shown in FIGS. 4-10 and not yet described above may be omitted. However, the specific support structure 400 illustrated in FIGS. 4-10 is configured to support field coil 328 having four field coil sections 328a, 328b, 328c and 328d, and further to support shield coil 318 having two shield coil sections 318a and 318b. Toward this end, support structure 400 includes additional elements or components as described below.

In particular, support structure 400 includes a fifth support element 430a, a sixth support element 430b, and a seventh support element 430c for supporting third and fourth field ring sections 328c and 328d. Beneficially, fifth, sixth and seventh support elements 430a, 430b, 430c, may each comprise an electrically nonconductive or electrically insulative material. In some embodiments, fifth, sixth and seventh support elements 430a, 430b, 430c may each comprise a flexible component which is deformable to some degree in the X, Y, Z and R directions. Furthermore, support structure 400 includes an eighth support element 440a, a ninth support element 440b, and a tenth support element 440c for supporting first and second shield ring sections 318a and 318b. Beneficially, eighth, ninth and tenth support elements 440a, 440b, 440c, may each comprise an electrically nonconductive or electrically insulative material.

Fifth support element 430a has a first portion which is disposed at a second site on third field coil section 328c (e.g., the "bottom" of third field coil section 328c), and a has second portion which is disposed at a second site on fourth field coil section 328d (e.g., the "bottom" of fourth field coil section 328d). As best seen in FIGS. 4, 6 and 10, fifth support element 430a further has a slot formed therein, and a portion of support ring 410 is disposed in the slot. Axial (X direction) movement of fifth support element 430a is restrained by virtue of the portion of support ring 410 being inserted within its slot. As best seen in FIG. 10, fifth support element 430a is rotationally (R direction) fixed with respect to support ring 410 by the pair of protrusions 450c. That is, the pair of protrusions 450c operates to restrain or prevent rotational movement of fifth support element 430a. By means of its interaction with support ring 410 as described above, fifth support element 430a axially (X direction) and rotationally (R direction) fixes the second site on third field coil section 328c (e.g., the bottom of third field coil section 328c) with respect to the second site on fourth field coil section 328d (e.g., the bottom of fourth field coil section 328d), but allows radial (substantially in the Y direction) movement or expansion of first and second field coil sections 328a and 328b at their respective second sites (e.g., at the bottoms thereof) by allowing support ring 410 to slide radially within the slot in fifth support element 430a.

Sixth support element 430b has a first portion which is disposed at a third site on third field coil section 328c (e.g., a first side which is rotated approximately 90 degrees from the "top" of third field coil section 328c), and a second portion which is disposed at a third site on fourth field coil section 328d (e.g., a first side which is rotated approximately 90 degrees from the "top" of fourth field coil section 328d). As best seen in FIGS. 4, 5, 6, 8 and 9, sixth support element 430b further has a slot formed therein, and a portion of support ring 410 is disposed in the slot. Axial (X direction) movement of sixth support element 430b is restrained by virtue of the portion of support ring 410 being inserted within its slot. By means of its interaction with support ring 410 as described above, sixth support element 430b axially (X direction) fixes the third site on third field coil section 328c with respect to the third site on third field coil section 328b, but allows rotational (R direction) and radial (substantially in the Y direction) movement or expansion of first and second field coil sections 328a and 328b at their respective third sites (e.g., at first sides thereof) by allowing support ring 410 to slide radially and rotationally within the slot in sixth support element 430b.

Seventh support element 430c is similar in construction and operation to sixth support element 430b. In particular, seventh support element 430c has a first portion which is disposed at a fourth site on third field coil section 328c (e.g., a second side which is rotated approximately 90 degrees from the "top" of third field coil section 328c), and a second portion which is disposed at a fourth site on fourth field coil section 328d (e.g., a second side which is rotated approximately 90 degrees from the "top" of fourth field coil section 328*d*). As best seen in FIGS. 8 and 9, seventh support element 430*c* further has a slot formed therein, and a portion of support ring 410 is disposed in the slot. Axial (X direction) movement of seventh support element 430*c* is restrained by virtue of the portion of support ring 410 being inserted within its slot. By means of its interaction with support ring 410 as described above, seventh support element 430*c* axially (X direction) fixes the fourth site on third field coil section 328*c* with respect to the fourth site on fourth field coil section 328*d*, but allows rotational (R direction) and radial (substantially in the Y direction) movement or expansion of first and second field coil sections 328*a* and 328*b* at their respective fourth sites (e.g., at second sides thereof) by allowing support ring 410 to slide radially and rotationally within the slot in seventh support element 430*c*.

Eighth support element 440*a* has a first portion which is disposed at a second site on first shield coil section 318*a* (e.g., the "bottom" of first shield coil section 318*a*), and has second portion which is disposed at a second site on second shield coil section 318*b* (e.g., the "bottom" of second shield coil section 318*b*). As best seen in FIGS. 4 and 10, eighth support element 440*a* further has a slot formed therein, and a portion of support ring 410 is disposed in the slot. Axial (X direction) movement of eighth support element 440*a* is restrained by virtue of the portion of support ring 410 being inserted within its slot. As best seen in FIG. 10, eighth support element 440*a* is rotationally (R direction) fixed with respect to support ring 410 by the pair of protrusions 450*a*. That is, the pair of protrusions 450*a* operates to restrain or prevent rotational movement of eighth support element 440*a*.

By means of its interaction with support ring 410 as described above, eighth support element 440*a* axially (X direction) and rotationally (R direction) fixes the second site on first shield coil section 318*a* (e.g., the bottom of first shield coil section 318*a*) with respect to the second site on second shield coil section 318*b* (e.g., the bottom of second shield coil section 318*b*), but allows radial (substantially in the Y direction) movement or expansion of first and second field coil sections 328*a* and 328*b* at their respective second sites (e.g., at the bottoms thereof) by allowing support ring 410 to slide radially within the slot in second support element 420*a*.

Ninth support element 440*b* has a first portion which is disposed at a third site on first shield coil section 318*a* (e.g., a first side which is rotated approximately 90 degrees from the "top" of first shield coil section 318*a*), and a second portion which is disposed at a third site on second shield coil section 318*b* (e.g., a first side which is rotated approximately 90 degrees from the "top" of second shield coil section 318*b*). As best seen in FIG. 4, ninth support element 440*b* further has a slot formed therein, and a portion of support ring 410 is disposed in the slot. Axial (X direction) movement of ninth support element 440*b* is restrained by virtue of the portion of support ring 410 being inserted within its slot. By means of its interaction with support ring 410 as described above, ninth support element 440*b* axially (X direction) fixes the third site on first shield coil section 318*a* with respect to the third site on third field coil section 328*b*, but allows rotational (R direction) and radial (substantially in the Y direction) movement or expansion of first and second field coil sections 328*a* and 328*b* at their respective third sites (e.g., at first sides thereof) by allowing support ring 410 to slide radially and rotationally within the slot in ninth support element 440*b*.

Tenth support element 440*c* is similar in construction and operation to ninth support element 440*b*. In particular, tenth support element 440*c* has a first portion which is disposed at a fourth site on first shield coil section 318*a* (e.g., a second side which is rotated approximately 90 degrees from the "top" of first shield coil section 318*a*), and a second portion which is disposed at a fourth site on second shield coil section 318*b* (e.g., a second side which is rotated approximately 90 degrees from the "top" of second shield coil section 318*b*). Tenth support element 440*c* further has a slot formed therein, and a portion of support ring 410 is disposed in the slot. Axial (X direction) movement of tenth support element 440*c* is restrained by virtue of the portion of support ring 410 being inserted within its slot. By means of its interaction with support ring 410 as described above, tenth support element 440*c* axially (X direction) fixes the fourth site on first shield coil section 318*a* with respect to the fourth site on second shield coil section 318*b*, but allows rotational (R direction) and radial (substantially in the Y direction) movement or expansion of first and second field coil sections 328*a* and 328*b* at their respective fourth sites (e.g., at second sides thereof) by allowing support ring 410 to slide radially and rotationally within the slot in tenth support element 440*c*.

As noted above, when field coil 328 and shield coil 318 are each energized with a substantial electrical current to produce strong magnetic field, they may each experience a radial expansion, and the amount of that radial expansion my differ between field coil 328 and shield coil 318. To illustrate this by example, in one example magnet system the field coil may have a diameter of about 1 meter, while the shield coil may have a diameter of about 1.7 meters. Furthermore, in this example, when energized the field coil and the shield coil may each experience a radial expansion of about 1 mm. Absent any provisions to accommodate this in the support structure(s) for the magnet system, this expansion would produce a small change in the relative alignment of the field coil and the shield coil. However, in general, the alignment of the coils and coil sections in the magnet system should be very precise—for example in the order of fractions of a millimeter.

Accordingly, in some embodiments support structure 400 may address this issue and maintain a desired alignment between field coil 328 and shield coil 318 by virtue of the interactions of support ring 410 and first through tenth support elements 402, 420*a*-*c*, 430 *a*-*c*, 440*a*-*c*, and protrusions 450*a*-*c*. In particular, as will be illustrated in greater detail below with respect to FIGS. 13 and 14, support structure 400 may be configured to cause the axis field coil 328 and the axis of shield coil 318 to be nonaligned or offset from each other by a small amount (e.g., less than a millimeter) when field coil 328 and/or shield coil 318 are de-energized. Then, when field coil 328 and shield coil 318 are energized and radially expand, support structure 400 is configured to cause the axes of field coil 328 and shield coil 318 to be aligned coaxially with each other.

Figure 11:
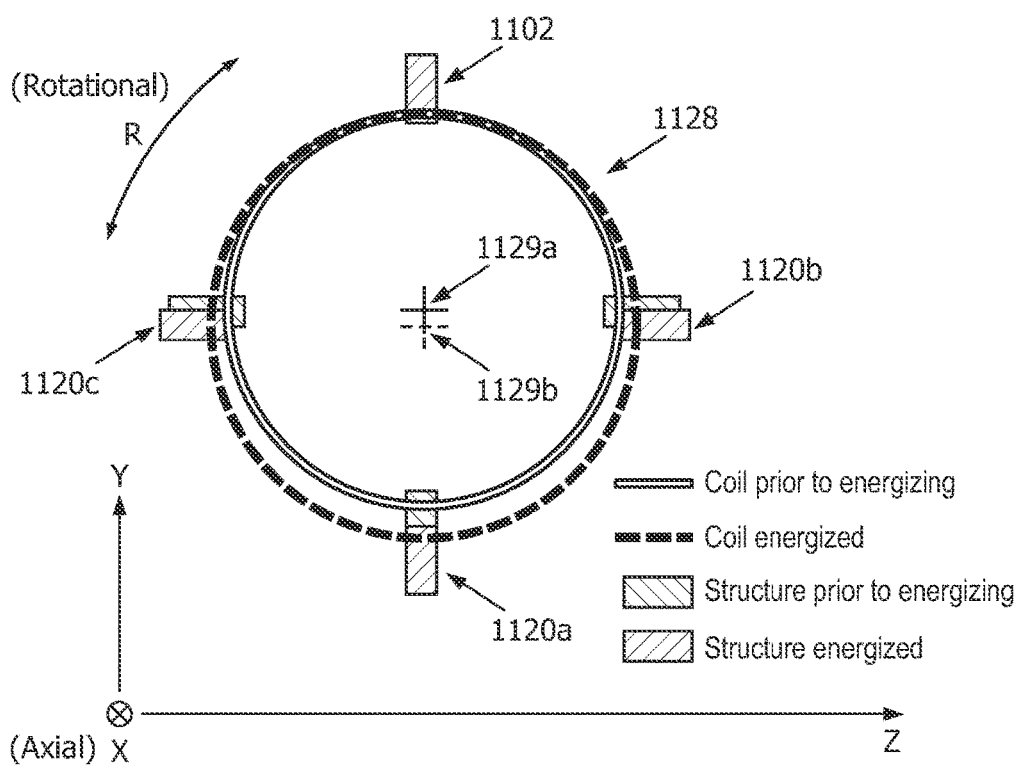
FIG. 11 is a first diagram for illustrating functional operation of a first example embodiment of a superconducting magnet system and a support structure for the superconducting magnet system.
Figure 12:
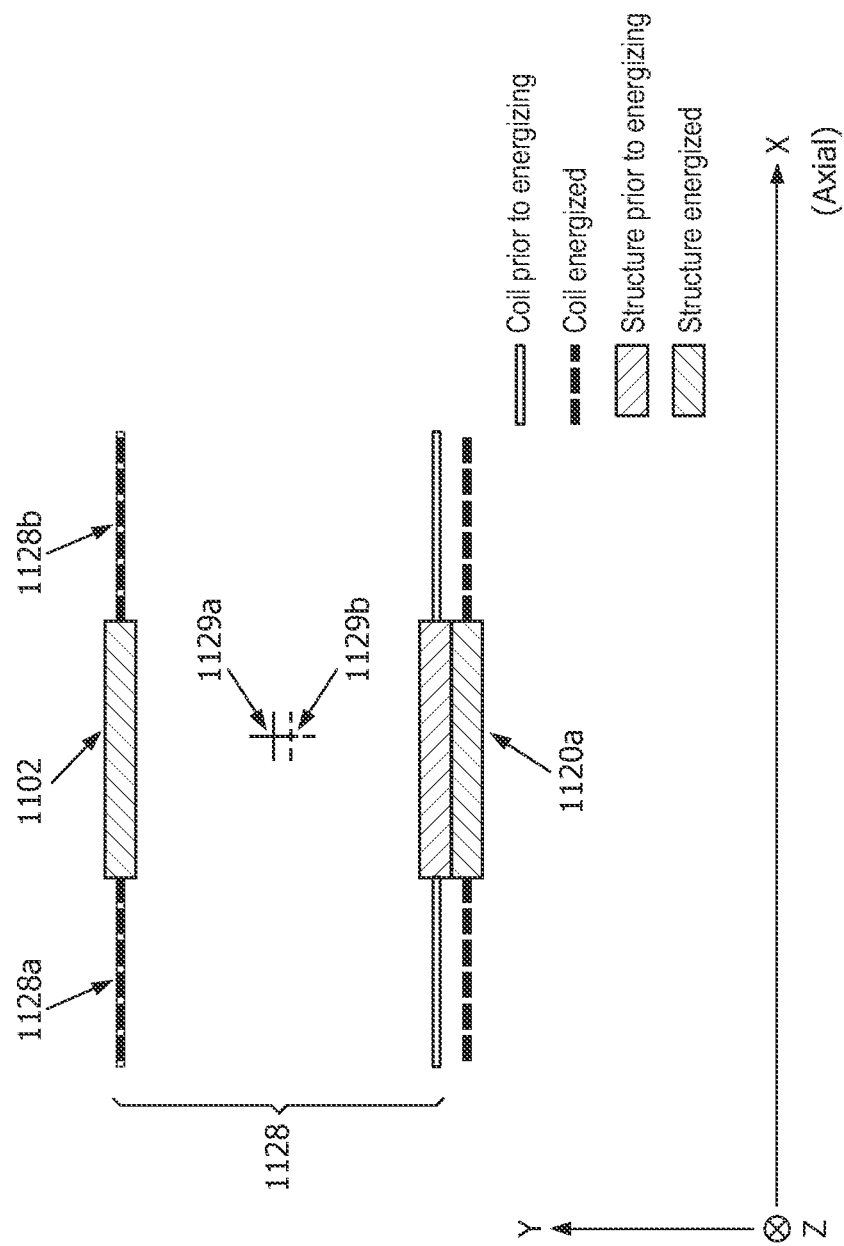
FIG. 12 is a second diagram for illustrating functional operation of the first example embodiment of a superconducting magnet system and a support structure for the superconducting magnet system.
Figure 13:
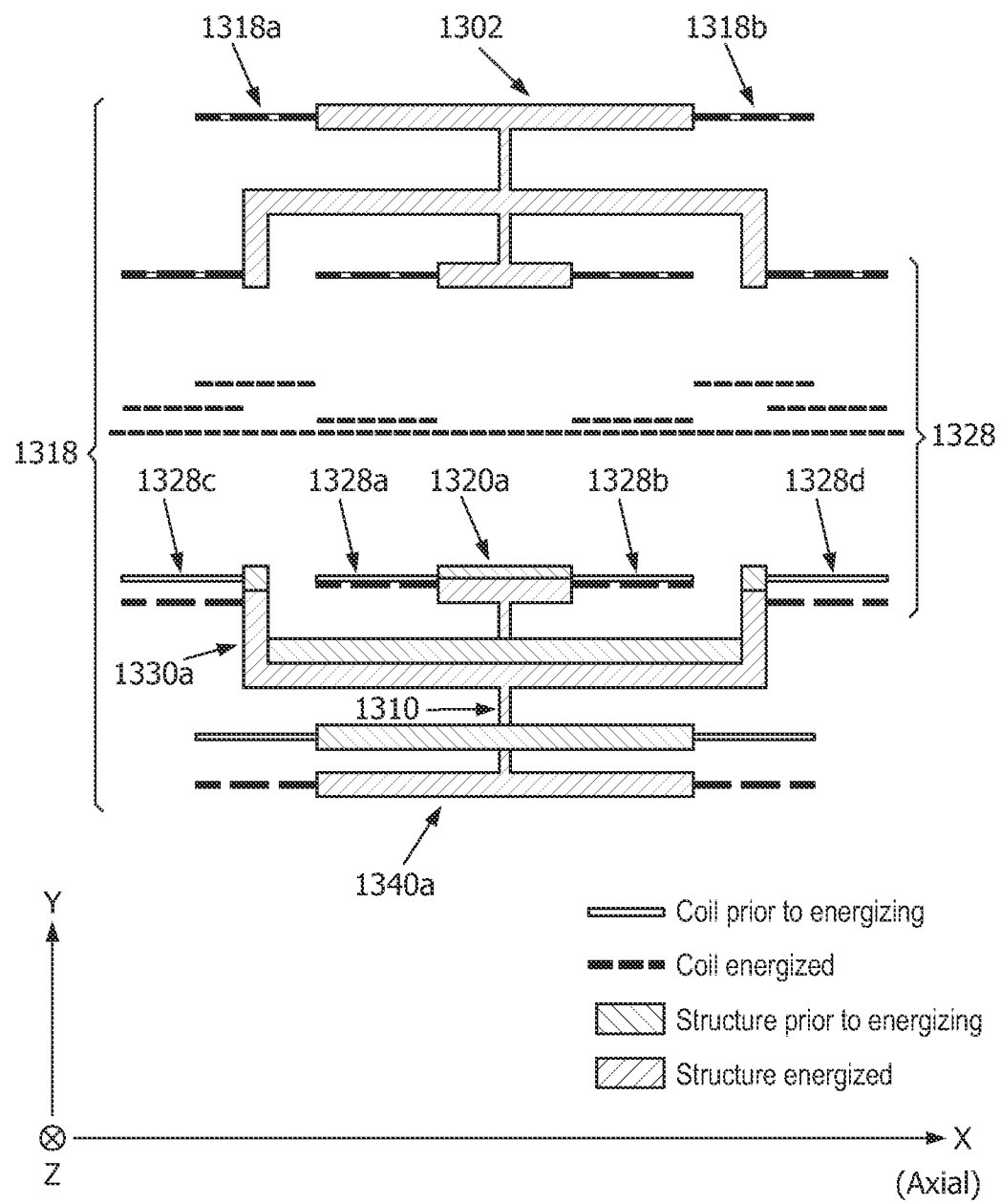
FIG. 13 is a first diagram for illustrating functional operation for a second example embodiment of a superconducting magnet system and a support structure of the superconducting magnet system.
Figure 14:
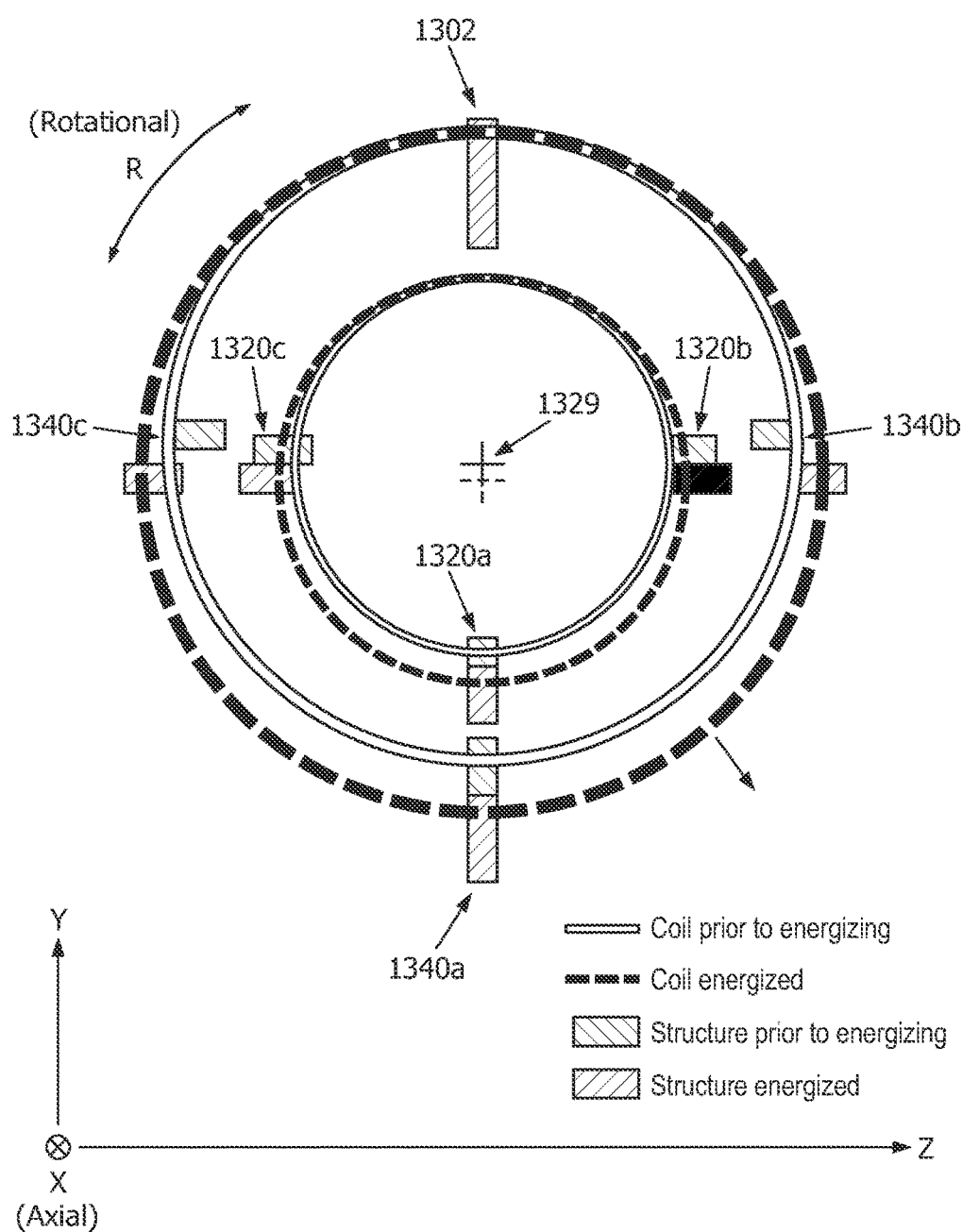
FIG. 14 is a second diagram for illustrating functional operation for the second example embodiment of a superconducting magnet system and a support structure of the superconducting magnet system.

FIGS. 11-14 helps to illustrate how a support structure such as support structure 400 may maintain relative axial positions of field coil sections of a field coil, and/or shield coil sections of a shield coil, to be fixed when the field coil and/or shield coil is energized and de-energized, while allowing field coil sections, and/or shield coil sections, to expand radially when energized. Furthermore, FIGS. 13 and 14 illustrate how a support structure such as support structure 400 may cause the axes of a field coil and a shield coil to be nonaligned or offset from each other when the field coil and/or shield coil are de-energized, and to cause the axes of the field coil and shield coil to be aligned coaxially with each other when they are both energized.

FIG. 11 is a first diagram for illustrating functional operation of a first example embodiment of a superconducting magnet system and a support structure for the superconducting magnet system, and FIG. 12 is a second diagram for illustrating functional operation of the first example embodiment of a superconducting magnet system and a support structure for the superconducting magnet system.

As illustrated in FIGS. 11 and 12, a coil 1128 is supported at the top, bottom and sides thereof by four support elements 1102, 1120a, 1120b and 1120c, respectively. In various embodiments, other support elements not shown in FIGS. 11 and 12 may also be employed. Here, support element 1102 axially, radially, and rotationally fixes the positions of the coil sections 1128a and 1128b with respect to each other. Support element 1120a fixes the relative axial (X-direction) positions and rotational (R direction) positions of coil sections 1128a and 1128b with respect to each other, but allows coil sections 1128a and 1128b to expand radially (generally in the Y direction). Support elements 1120b and 1120c each fix the relative axial (X-direction) positions of coil sections 1128a and 1128b with respect to each other, but allow coil sections 1128a and 1128b to rotate (R direction) positions of expand radially (in the Y-Z plane).

FIGS. 11 and 12 illustrate the positions of coil 1128 and coil sections 1128a and 1128b (solid lines), and of support elements 1102, 1120a, 1120b and 1120c, prior to energization of coil 1128, and the positions of coil 1128 and coil sections 1128a and 1128b (dashed lines), and of support elements 1102, 1120a, 1120b and 1120c, after coil 1128 has been energized. The differences in the pre-energization and post-energization positions have been exaggerated in FIGS. 11 and 12 to more clearly indicate the differences. As a result of radial expansion of coil 1128 when energized, it can be seen from FIGS. 11 and 12 that the axis of coil 1128 has been shifted in the Y direction. That is, the unenergized coil 1128 has an axis 1129a, while the energized coil 1128 has an axis 1129b.

FIG. 13 is a first diagram for illustrating functional operation for a second example embodiment of a superconducting magnet system and a support structure of the superconducting magnet system, and FIG. 14 is a second diagram for illustrating functional operation for the second example embodiment of a superconducting magnet system and a support structure of the superconducting magnet system.

As illustrated in FIGS. 13 and 14, a first coil 1328 (e.g., a field coil) has four coil sections 1328a, 1328b, 1328c and 1328d which are supported at the top, bottom and sides thereof by support elements 1302, 1320a, 1330a, 1320b, 1320c, and other side support elements not shown in FIGS. 13 and 14. Similarly, a second coil 1318 (e.g., a shield coil) has two coil sections 1318a and 1318b which are supported at the top, bottom and sides thereof by support elements 1302, 1340a, 1340b, 1340c, respectively.

Here, support element 1302 axially, radially, and rotationally fixes the positions of the coil sections 1328a-d with respect to each other, and also axially, radially, and rotationally fixes the positions of the coil sections 1318a and 1318b with respect to each other. Support element 1320a fixes the relative axial (X-direction) positions and rotational (R direction) positions of coil sections 1328a and 1328b with respect to each other, but allows coil sections 1328a and 1328b to expand radially (generally in the Y direction). Support element 1330a fixes the relative axial (X-direction) positions and rotational (R direction) positions of coil sections 1328c and 1328d with respect to each other, but allows coil sections 1328c and 1328d to expand radially (generally in the Y direction).

Support elements 1320b and 1320c each fix the relative axial (X-direction) positions of coil sections 1328a and 1328b with respect to each other, but allow coil sections 1328a and 1328b to rotate (R direction) positions of expand radially (in the Y-Z plane). Other side support elements, not shown in FIGS. 13 and 14, each fix the relative axial (X-direction) positions of coil sections 1328c and 1328d with respect to each other, but allow coil sections 1328c and 1328d to rotate (R direction) positions of expand radially (in the Y-Z plane).

FIGS. 13 and 14 illustrate the positions of coil 1318, coil 1328, and coil sections 1328a-d, and 1318a-b (solid lines), and of support elements 1302, 1320a-c, 1330a and 1340a-c, prior to energization of coils 1318 and 1328, and the positions of coil 1318, coil 1328, and coil sections 1328a-d, and 1318a-b (dashed lines), and of support elements 1302, 1320a-c, 1330a and 1340a-c after coils 1318 and 1328 have been energized. The differences in the pre-energization and post-energization positions have been exaggerated in FIGS. 13 and 14 to more clearly indicate the differences. As a result of radial expansion of coils 1318 and 1328 when energized, it can be seen from FIGS. 13 and 14 that the axes of coil 1318 and 1328 have been shifted in the Y direction. That is, the axes of coils 1318 and 1328 are nonaligned or offset from each other when coils 1318 and 1328 are not energized, but the axes of coils 1318 and 1328 are coaxially aligned with each other when coils 1318 and 1328 are energized.

Although the embodiments illustrated above with respect to FIGS. 4-14 include four support elements for each pair of coil sections of the field coil and shield coil, spaced angularly 90 degrees apart with respect to each other, it should be understood that in other embodiments or variations of these embodiments, the support structure may include more than four support elements for each coil section pair, for example six support elements (which may be spaced 60 degrees apart, for example) or eight support elements (which may be spaced 45 degrees apart, for example), etc.

Figure 15:
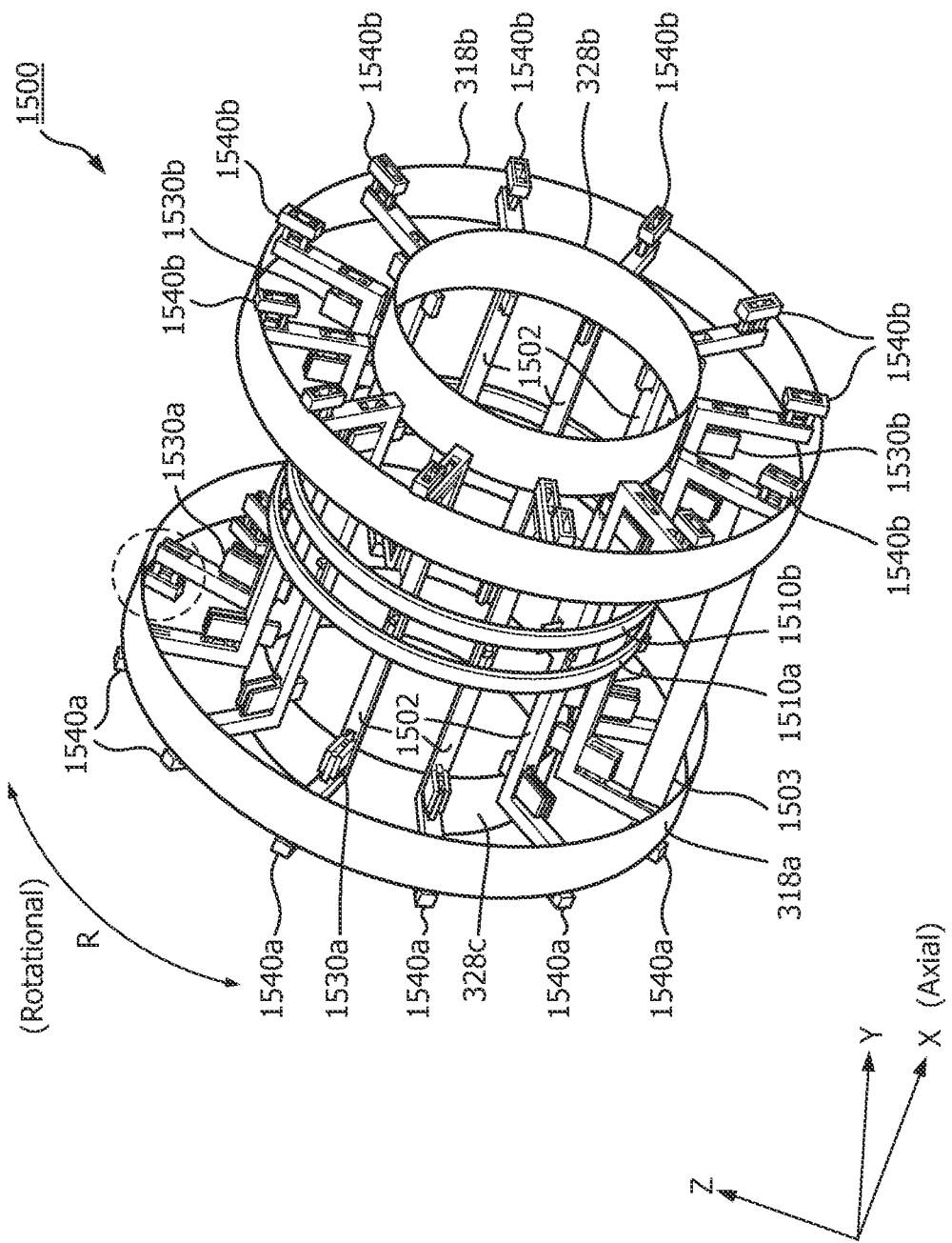
FIG. 15 is a perspective view of a portion of another exemplary embodiment of a superconducting magnet system and a support structure for the superconducting magnet system.
Figure 16:
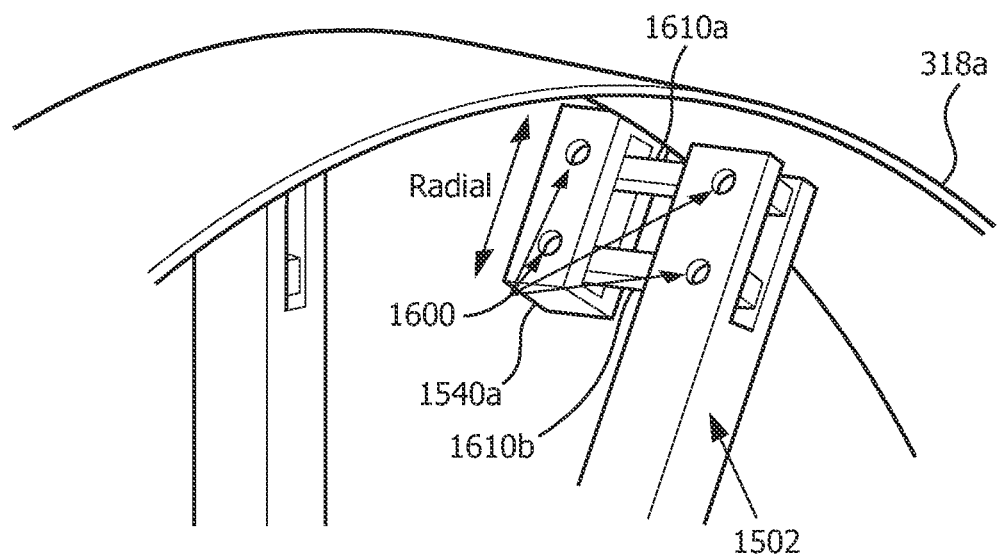
FIG. 16 is a close-up view of a portion of the exemplary embodiment of a superconducting magnet system and a support structure for the superconducting magnet system shown in FIG. 15.

FIG. 15 is a perspective view of a portion of another exemplary embodiment of a superconducting magnet system and a support structure 1500 for the superconducting magnet system. FIG. 16 is a close-up view of a portion of the exemplary embodiment of a superconducting magnet system and support structure 1500, illustrating in greater detail the area with the dashed-line circle shown in FIG. 15. In some embodiments, the superconducting magnet system of FIGS. 15 and 16 may comprise magnet system 102, superconducting magnet system 200, and/or superconducting magnet system 300.

Support structure 1500 includes a plurality of similar or identical structures, and not all of these structures are labeled, for clarity of illustration. As with FIGS. 4-10, FIGS. 15 and 16 illustrate X, Y, Z, and R directions, the X direction being the axial direction, the R direction being the rotational direction, and radial expansion or movement occurring in the Y-Z plane.

Support structure 1500 illustrates a particular embodiment which is configured with elements or components to support both first electrically conductive coil (e.g., field coil 328) and second electrically conductive coil (e.g., shield coil 318). However, in other embodiments, support structure 1500 may only include elements or components for supporting only field coil 328 or only shield coil 318. Additionally, although for simplicity of illustration in FIG. 15 only two field coil sections 328c and 328d are shown, in general field support structure 1500 may also support field coil sections 328a and 328b as shown in FIG. 3. Furthermore, variations of support structure 1500 may be configured to support more or less than four field coil sections, and/or more than two shield coil sections.

Like support structure 400, support structure 1500 may be configured, among other things, to support first and second shield coil sections 318a and 318b, and to maintain relative axial positions of first and second shield coil sections 318a and 318b to be fixed when shield coil 318 is energized and de-energized, while allowing first and second shield coil sections 328a and 328b to expand radially when energized. Also, support structure 1500 may be configured, among other things, to support field coil sections 328c and 328d, and to maintain relative axial positions of field coil sections 328c and 328d to be fixed when field coil 328 is energized and de-energized, while allowing field coil sections 328c and 328d to expand radially when energized. Similarly, support structure 1500 may be configured, among other things, to support field coil sections 328a and 328b, and to maintain relative axial positions of field coil sections 328a and 328b to be fixed when field coil 328 is energized and de-energized, while allowing field coil sections 328a and 328b to expand radially when energized.

Support structure 1500 includes a plurality of support beams 1502, first support elements 1530a, second support elements 1530b, third support elements 1540a, and fourth support elements 1540b. As illustrated in FIG. 15, support structure 1500 includes 12 support beams 1502, 12 first support elements 1530a, 12 second support elements 1530b, 12 third support elements 1540a, and 12 fourth support elements 1540b. However, for clarity, not all of the 12 support beams 1502, 12 first support elements 1530a, 12 second support elements 1530b, 12 third support elements 1540a, and 12 fourth support elements 1540b are labeled in FIG. 15. Furthermore, variations of support structure 1500 may have more or less than 12 support beams 1502, 12 first support elements 1530a, 12 second support elements 1530b, 12 third support elements 1540a, and 12 fourth support elements 1540b. In some embodiments, support beams 1502 comprise rigid structural elements. In some embodiments, support beams 1502 may comprise aluminum or other non-magnetic metal. In other embodiments, support beams 1502 may comprise graphite.

In some embodiments, first, second, third, and fourth support elements 1530a, 1530b, 1530c and 1530d may each comprise an electrically nonconductive or electrically insulative material. In some embodiments, 1530a, 1530b, 1530c and 1530d may each comprise a rigid structure.

Support structure 1500 further includes first and second support rings 1510a and 1510b. Support rings 1510a and 1510b are aligned substantially in parallel with field coil 328 and shield coil 318. More specifically, the axes of rings 1510a and 1510b extend in the X direction in parallel to the axis of field coil 328 and the axis of shield coil 318. In some embodiments, the axes of support rings 1510a and 1510b may be coaxially aligned with the axes of field coil 328 and shield coil 318. In some embodiments, support rings 1510a and 1510b may be fixedly attached (directly or indirectly) to an interior wall of a cryostat, such as cryostat 210 and/or cryostat 320. Variations of support structure 1500 may include only one support ring, or may include more than two support rings.

Each support beam 1512 is connected to first and second support rings 1510a and 1510b, for example by epoxy or via a welded connection. Each support beam 1512 is also connected to each of a corresponding one of the first support elements 1530a, a corresponding one of the second support elements 1530b, a corresponding one of the third support elements 1540a, and a corresponding one of the fourth support elements 1540b via a pair of hinge members, including first and second hinge members 1610a and 1610b, as best seen in FIG. 16.

Each of first support elements 1530a is connected to field coil section 328c at a corresponding site on field coil section 328a, for example by epoxy. Similarly, each of second support elements 1530b is connected to field coil section 328d at a corresponding site on field coil section 328c, each of third support elements 1540a is connected to shield coil section 318a at a corresponding site on field coil section 318a, and each of fourth support elements 1540b is connected to shield coil section 318b at a corresponding site on shield coil section 318b.

In combination with support beams 1502 and first and second support rings 1510a and 1510b, each of third support elements 1540a and fourth support elements 1540b axially (X direction) and rotationally (R direction) fix the corresponding sites on shield coil section 318a and shield coil section 318b with respect to each other, but allow shield coil section 318a and shield coil section 318b to expand radially (X-Y plane), either independently or together, for example in response to energization of shield coil 318.

In this regard, the use of hinge member pairs 1610a and 1620b to attach each support beam 1502 to third support elements 1540a, for example, creates four hinge points 1600 with respect to each third support element 1540a. As a result, the pivoting action of each hinge member pair 1610a and 1620b causes movement of each third support element 1540a to be maintained in the radial direction, as best seen in FIG. 16. A similar situation applies with respect to fourth support elements 1540b.

Similarly, in combination with support beams 1502 and first and second support rings 1510a and 1510b, each of first support elements 1530a and second support elements 1530b axially (X direction) and rotationally (R direction) fix the corresponding sites on field coil section 328c and field coil section 328d with respect to each other, but allow field coil section 328c and field coil section 328d to expand radially (X-Y plane), either independently or together, for example in response to energization of field coil 328.

In this regard, the use of hinge member pairs 1610a and 1620b to attach each support beam 1502 to first support elements 1530a, for example, creates four hinge points 1600 with respect to each first support element 1530a. As a result, the pivoting action of hinge member pair 1610a and 1620b causes movement of each first support element 1530a to be maintained in the radial direction. A similar situation applies with respect to second support elements 1530b.

In some embodiments, support structure 1500 may include one or more tie bars 1503. Each tie bar 1503 may extend across a corresponding one of the support beams 1502 and may increase the strength and structural integrity of support beams 1502 and support structure 1500. Other embodiments may omit tie bar(s) 1503.

Figure 17:
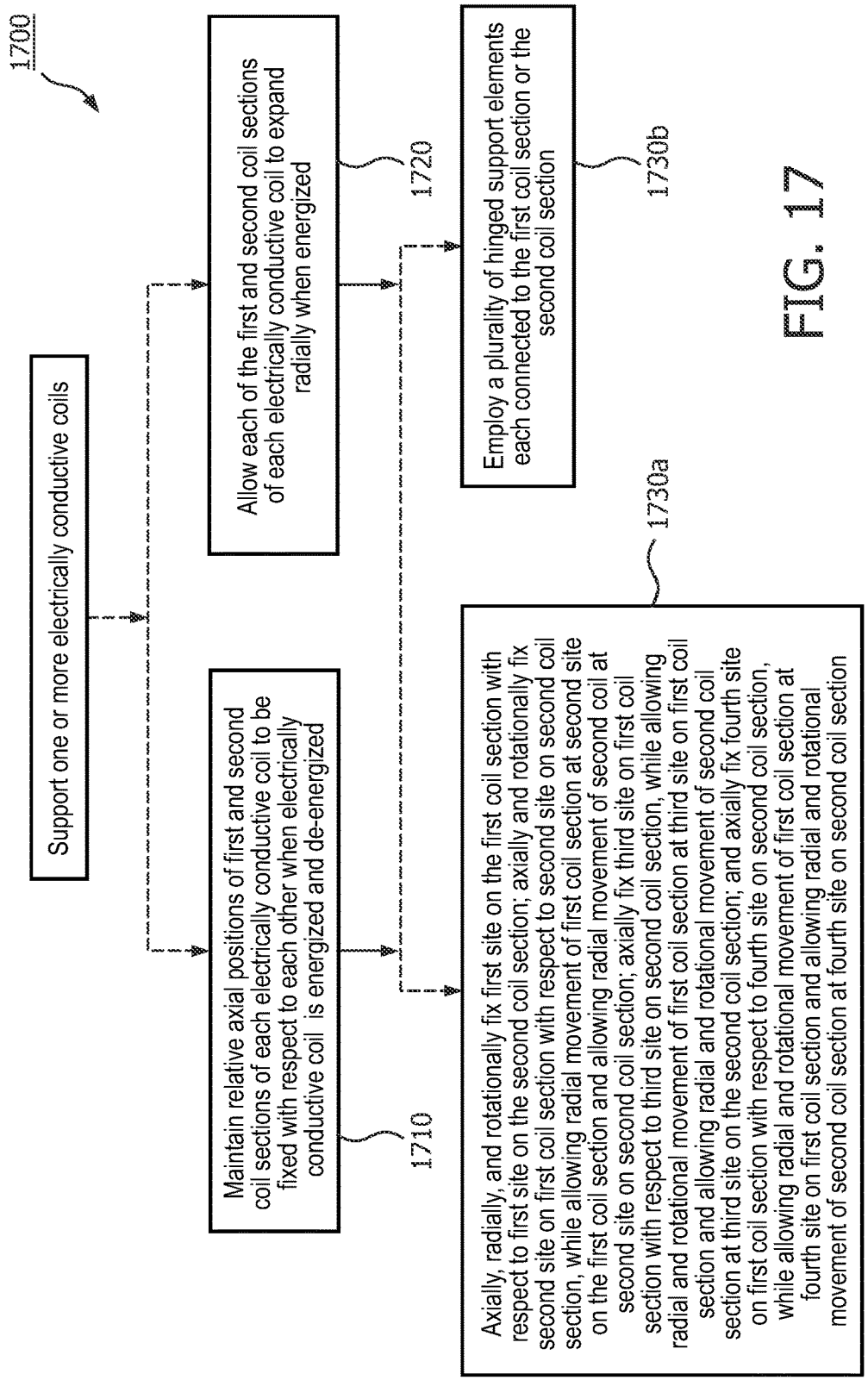
FIG. 17 is a flowchart illustrating an embodiment of a method of supporting one or more electrically conductive coils of a superconducting magnet system.

FIG. 17 is a flowchart illustrating an embodiment of a method 1700 of supporting one or more electrically conductive coils of a superconducting magnet system. Method 1700 may be implemented by various support structures illustrated above with respect to FIGS. 4-16.

Method 1700 includes an operation 1710 of maintaining relative axial positions of the first and second coil sections of each electrically conductive coil to be fixed with respect to each other when the first electrically conductive coil is energized and de-energized, and an operation 1720 of allowing each of the first and second coil sections to expand radially when energized. Depending on the type of support structure which is implemented, the method may include one of the further operations 1730a or 1730b.

When operation 1730a is performed, the support structure: axially, radially, and rotationally fixes a first site on the first coil section with respect to a first site on the second coil section; axially and rotationally fixes a second site on first coil section with respect to a second site on the second coil section, while allowing radial movement of the first coil section at the second site on the first coil section and allowing radial movement of the second coil at the second site on the second coil section; axially fixing a third site on the first coil section with respect to a third site on the second coil section, while allowing radial and rotational movement of the first coil section at the third site on the first coil section and allowing radial and rotational movement of the second coil section at the third site on the second coil section; and axially fixing a fourth site on first coil section with respect to a fourth site on second coil section, while allowing radial and rotational movement of the first coil section at the fourth site on the first coil section and allowing radial and rotational movement of the second coil section at the fourth site on the second coil section.

In some embodiments where the support structure supports a first (field) coil and a second (shield coil), when operation 1730a is performed the axis of the field coil and the axis of the shield coil may be nonaligned when at least one of the field coil and the shield coil is de-energized, and the axis of the field coil and the axis of the shield coil may be aligned coaxially when the field coil and the shield coil are both energized.

When operation 1730b is performed, the support structure allows each of the first and second coil sections to expand radially when energized via a plurality of hinged support elements each connected to the first coil section or the second coil section.

While preferred embodiments are disclosed herein, many variations are possible which remain within the concept and scope of the invention. For example, embodiments have been described above in the context of a helium bath type system. However, in other embodiments, it is possible that the principles disclosed herein may be adapted to be employed in a "cryofree" or sealed system. Such variations would become clear to one of ordinary skill in the art after inspection of the specification, drawings and claims herein. The present invention therefore is not to be restricted except within the scope of the appended claims.

What is claimed is:

1. An apparatus, comprising:
   at least a first electrically superconductive coil having at least first and second coil sections which are axially separated and axially spaced apart from each other; and
   a support structure disposed to support the first and second coil sections, wherein the support structure is configured to maintain relative axial positions of the first and second coil sections to be fixed when the first electrically conductive coil is energized and de-energized, and to allow each of the first and second coil sections to expand radially when energized;
   a first support element which has a first portion which is disposed at a first site on the first coil section, and a second portion which is disposed at a first site on the second coil section, wherein the first support element axially, radially, and rotationally fixes the first site on the first coil section with respect to the first site on the second coil section;
   a second support element which has a first portion which is disposed at a second site on the first coil section, and a second portion which is disposed at a second site on the second coil section, wherein the second support element axially and rotationally fixes the second site on the first coil section with respect to the second site on the second coil section, and allows radial movement of the first and second coil sections;
   a third support element which has a first portion which is disposed at a third site on the first coil section, and a second portion which is disposed at a third site on the second coil section, wherein the third support element axially fixes the third site on the first coil section with respect to the third site on the second coil section, and allows radial and rotational movement at the third sites of the first and second coil sections; and
   a fourth support element which has a first portion which has a first portion which is disposed at a fourth site on the first coil section, and a second portion which is disposed at a fourth site on the second coil section, wherein the fourth support element axially fixes the fourth site on the first coil section with respect to the fourth site on the second coil section, and allows radial and rotational movement at the fourth sites of the first and second coil sections.

2. The apparatus of claim 1, further comprising at least a second electrically conductive coil,
   wherein the first electrically conductive coil is a field coil and the second electrically conductive coil is a shield coil,
   wherein the shield coil has at least first and second shield coil sections which are separated and spaced apart from each other
   wherein the shield coil has a diameter which is greater than a diameter of the field coil,
   wherein an axis of the shield coil passes through a circumference defined by the field coil, and
   wherein the support structure is configured to maintain relative axial positions of the first and second shield coil sections to be fixed when the first electrically conductive coil is energized and de-energized, and allows each of the first and second shield coil sections to expand radially when energized.

3. The apparatus of claim 1, wherein the support structure further comprises a support ring having an axis which extends in parallel to an axis of the first electrically conductive coil, wherein the electrically insulating support ring is fixedly attached to the first support element, and
   wherein each of the third and fourth support elements has a slot disposed therein, wherein a first portion of the electrically insulating support ring is disposed in the slot in the third support element, and a second portion of the electrically insulating support ring is disposed in the slot in the fourth support element.

4. The apparatus of claim 3, wherein the support ring includes at least one rotational restraint, wherein the second support element has a slot disposed therein, wherein a third portion of the support ring is disposed in the slot in the second support element, and wherein the second support element is rotationally fixed by the at least one rotational restraint.

5. The apparatus of claim 3, further comprising at least a second electrically conductive coil, wherein the first electrically conductive coil is a field coil and the second electrically conductive coil is a shield coil,
   wherein the shield coil has at least first and second shield coil sections which are separated and spaced apart from each other, wherein the shield coil has a diameter which is greater than a diameter of the field coil, wherein an axis of the shield coil passes through a circumference defined by the field coil, and wherein the support structure is configured to maintain relative axial positions of the first and second shield coil sections to be fixed when the first electrically conductive coil is energized and de-energized, and allows each of the first and second shield coil sections to expand radially when energized, wherein the first support element has a third portion which is disposed at a first site on the first shield coil section, and a fourth portion which is disposed at a first site on the second shield coil section, wherein the first support element axially, radially, and rotationally fixes the first site on the first shield coil section with respect to the first site on the second field coil section, and wherein the support structure further comprises:

a fifth support element which has a first portion which is disposed at a second site on the first shield coil section, and a second portion which is disposed at a second site on the second shield coil section, wherein the fifth support element axially and rotationally fixes the second site on the first shield coil section with respect to the second site on the second shield coil section, and allows radial movement of the first and second shield coil sections;

a sixth support element which has a first portion which is disposed at a third site on the first shield coil section, and a second portion which is disposed at a third site on the second shield coil section, wherein the sixth support element axially fixes the third site on the first shield coil section with respect to the third site on the second shield coil section, and allows radial and rotational movement of the first and second shield coil sections; and a seventh support element which has a first portion which is disposed at a fourth site on the first shield coil section, wherein the seventh support element axially fixes the fourth site on the first shield coil section with respect to the fourth site on the second shield coil section, and allows radial and rotational movement of the first and second shield coil sections.

6. The apparatus of claim 1, wherein the support structure comprises:

at least one support ring having an axis which extends in parallel to an axis of the first electrically conductive coil;

a plurality of support beams connected to the support ring;

a plurality of first support elements each connected to the first coil section;

a plurality of second support elements each connected to the second coil section; and a plurality of hinge member pairs, each hinge member pair connecting one of the first and second support elements to one of the support beams, wherein the first and second support elements are configured to inhibit rotational and axial movement of the first and second coil sections with respect to each other, and wherein the hinge member pairs allow radial movement of the first and second coil sections.

7. The apparatus of claim 6, further comprising at least a second electrically conductive coil, wherein the first electrically conductive coil is a field coil and the second electrically conductive coil is a shield coil, wherein the shield coil has at least first and second shield coil sections which are separated and spaced apart from each other wherein the shield coil has a diameter which is greater than a diameter of the field coil, wherein an axis of the shield coil passes through a circumference defined by the field coil, and wherein the support structure is configured to maintain relative axial positions of the first and second shield coil sections to be fixed when the first electrically conductive coil is energized and de-energized, and allows each of the first and second shield coil sections to expand radially when energized.

8. The apparatus of claim 7, wherein the support structure further comprises:

a plurality of third support elements each connected to the first shield coil section;

a plurality of fourth support elements each connected to the second shield coil section; and a plurality of second hinge member pairs, each second hinge member pair connecting one of the third and fourth support elements to one of the support beams, wherein the third and fourth support elements are configured to inhibit rotational and axial movement of the first and second shield coil sections with respect to each other, and wherein the second hinge member pairs allow radial movement of the first and second shield coil sections.

9. A method of supporting at least a first electrically conductive coil having at least first and second coil sections which are separated and spaced apart from each other, the method comprising:

maintaining relative axial positions of the first and second coil sections to be fixed when the first electrically conductive coil is energized and de-energized; and allowing each of the first and second coil sections to expand radially when energized;

axially, radially, and rotationally fixing a first site on the first coil section with respect to a first site on the second coil section;

axially and rotationally fixing a second site on the first coil section with respect to a second site on the second coil section, while allowing radial movement of the first coil section at the second site on the first coil section and allowing radial movement of the second coil at the second site on the second coil section;

axially fixing a third site on the first coil section with respect to a third site on the second coil section, while allowing radial and rotational movement of the first coil section at the third site on the first coil section and allowing radial and rotational movement of the second coil section at the third site on the second coil section; and axially fixing a fourth site on the first coil section with respect to a fourth site on the second coil section, while allowing radial and rotational movement of the first coil section at the fourth site on the first coil section and allowing radial and rotational movement of the second coil section at the fourth site on the second coil section.

10. The method of claim 9, further comprising supporting at least a second electrically conductive coil, wherein the first electrically conductive coil is a field coil and the second electrically conductive coil is a shield coil, wherein the shield coil has at least first and second shield coil sections which are separated and spaced apart from each other, wherein the shield coil has a diameter which is greater than a diameter of the field coil, wherein an axis of the shield coil passes through a circumference defined by the field coil, the method further comprising:

maintaining relative axial positions of the first and second shield coil sections to be fixed when the first electrically conductive coil is energized and de-energized, and allowing each of the first and second shield coil sections to expand radially when energized.

11. The method of claim 10, further comprising the axis of the field coil and an axis of the shield coil being nonaligned when at least one of the field coil and the shield coil is de-energized, and the axis of the field coil and the axis of the shield coil being aligned coaxially when the field coil and the shield coil are both energized.

12. The method of claim 10, further comprising:

axially, radially, and rotationally fixing a first site on the first shield coil section with respect to a first site on the second shield coil section;

axially and rotationally fixing a second site on the first shield coil section with respect to a second site on the second shield coil section, while allowing radial movement of the first shield coil section at the second site on the first shield coil section and allowing radial movement of the second shield coil at the second site on the second shield coil section;

axially fixing a third site on the first shield coil section with respect to a third site on the second shield coil section, while allowing radial and rotational movement of the first shield coil section at the third site on the first shield coil section and allowing radial and rotational movement of the second shield coil section at the third site on the second shield coil section; and axially fixing a fourth site on the first shield coil section with respect to a fourth site on the second shield coil section, while allowing radial and rotational movement of the first shield coil section at the fourth site on the first shield coil section and allowing radial and rotational movement of the second shield coil section at the fourth site on the second shield coil section.

13. The method of claim 9, further comprising allowing each of the first and second coil sections to expand radially when energized via a plurality of hinged support elements each connected to one of the first coil section and the second coil section.

14. The method of claim 13, further comprising supporting at least a second electrically conductive coil, wherein the first electrically conductive coil is a field coil and the second electrically conductive coil is a shield coil, wherein the shield coil has at least first and second shield coil sections which are separated and spaced apart from each other, wherein the shield coil has a diameter which is greater than a diameter of the field coil, wherein an axis of the shield coil passes through a circumference defined by the field coil, the method further comprising:

maintaining relative axial positions of the first and second shield coil sections to be fixed when the first electrically conductive coil is energized and de-energized, and allowing each of the first and second shield coil sections to expand radially when energized via a plurality of additional hinged support elements each connected to one of the first shield coil section and the second shield coil section.

15. An apparatus, comprising:
an electrically conductive field coil;
an electrically conductive shield coil, wherein the shield coil has a diameter which is greater than a diameter of the field coil, and wherein an axis of the shield coil passes through a circumference defined by the field coil; and
a support structure disposed to support the field coil and the shield coil,
wherein the support structure is configured to cause an axis of the field coil and the axis of the shield coil to be nonaligned with each other when at least one of the field coil and the shield coil is de-energized, and to cause the axis of the field coil and the axis of the shield coil to be aligned coaxially with each other when the field coil and the shield coil are both energized.

16. The apparatus of claim 15, wherein the field coil has at least first and second field coil sections which are separated and spaced apart from each other, and wherein the field coil has at least first and second field coil sections which are separated and spaced apart from each other.

17. The apparatus of claim 16, wherein the support structure is configured to maintain relative axial positions of the first and second field coil sections to be fixed when the electrically conductive field coil is energized and de-energized, and to allow each of the first and second field coil sections to expand radially when energized, and wherein the support structure is further configured to maintain relative axial positions of the first and second shied coil sections to be fixed when the electrically conductive shield coil is energized and de-energized, and to allow each of the first and second shield coil sections to expand radially when energized.

18. The apparatus of claim 15, wherein the support structure further comprises:

a support ring having an axis which extends in parallel to the axis of the field coil and the axis of the shield coil; and a plurality of support elements operatively engaged with the field coil, the shield coil, and the electrically insulating support ring so as to fix axial positions of the field coil and the shield coil with respect to each other, while permitting radial expansion of the field coil and radial expansion of the shield coil, wherein an amount of radial expansion of the field coil is different from an amount of radial expansion of the shield coil.

19. The apparatus of claim 15, wherein the support structure includes:

a first support element configured to axially, radially, and rotationally fix a first site of the field coil, a second support element to configured to axially and rotationally fix a second site on the field coil while allowing radial movement of the field coil at the second site, a third support element configured to axially fix a third site on the field coil while allowing radial and rotational movement of the field coil at the third site, and a fourth support element configured to axially fix a fourth site on the field coil while allowing radial and rotational movement of the field coil at the fourth site.

20. The apparatus of claim 15, wherein the shield coil has at least first and second shield coil sections which are separated and spaced apart from each other, wherein the shield coil has a diameter which is greater than a diameter of the field coil, wherein an axis of the shield coil passes through a circumference defined by the field coil, and wherein the support structure is configured to maintain relative axial positions of the first and second shield coil sections to be fixed when the first electrically conductive coil is energized and de-energized, and allows each of the first and second shield coil sections to expand radially when energized, wherein the first support element has a third portion which is disposed at a first site on the first shield coil section, and a fourth portion which is disposed at a first site on the second shield coil section, wherein the first support element axially, radially, and rotationally fixes the first site on the first shield coil section with respect to the first site on the second field coil section, and wherein the support structure further comprises:

a fifth support element which has a first portion which is disposed at a second site on the first shield coil section, and a second portion which is disposed at a second site on the second shield coil section, wherein the fifth support element axially and rotationally fixes the second site on the first shield coil section with respect to the second site on the second shield coil section, and allows radial movement of the first and second shield coil sections;

a sixth support element which has a first portion which is disposed at a third site on the first shield coil section, and a second portion which is disposed at a third site on the second shield coil section, wherein the sixth support element axially fixes the third site on the first shield coil section with respect to the third site on the second shield coil section, and allows radial and rotational movement of the first and second shield coil sections; and a seventh support element which has a first portion which is disposed at a fourth site on the first shield coil section, wherein the seventh support element axially fixes the fourth site on the first shield coil section with respect to the fourth site on the second shield coil section, and allows radial and rotational movement of the first and second shield coil sections.

* * * * *